United States Patent
Fukasawa et al.

(10) Patent No.: US 9,488,677 B2
(45) Date of Patent: Nov. 8, 2016

(54) PROBE CARD HAVING A WIRING SUBSTRATE

(71) Applicant: SHINKO ELECTRIC INDUSTRIES CO., LTD., Nagano-shi, Nagano (JP)

(72) Inventors: Ryo Fukasawa, Nagano (JP); Michio Horiuchi, Nagano (JP); Yasue Tokutake, Nagano (JP); Yuichi Matsuda, Nagano (JP); Mitsuhiro Aizawa, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 207 days.

(21) Appl. No.: 14/064,608

(22) Filed: Oct. 28, 2013

(65) Prior Publication Data

US 2014/0125372 A1    May 8, 2014

(30) Foreign Application Priority Data

Nov. 5, 2012  (JP) .................................. 2012-243681
Jun. 20, 2013  (JP) .................................. 2013-129815

(51) Int. Cl.
*G01R 3/00*  (2006.01)
*G01R 1/073*  (2006.01)

(52) U.S. Cl.
CPC .............. *G01R 3/00* (2013.01); *G01R 1/07314* (2013.01)

(58) Field of Classification Search
CPC .... G01R 3/00; G01R 1/073; G01R 1/07314; G01R 1/0416; G01R 1/07342; G01R 31/2601; G01R 31/2886; G01R 31/00; G01R 1/07371
USPC .................................................... 324/756.03
See application file for complete search history.

(56) References Cited

U.S. PATENT DOCUMENTS

| 6,100,815 A * | 8/2000 | Pailthorp ................. 324/754.07 |
| 7,030,633 B1 * | 4/2006 | Qiu et al. ...................... 324/719 |
| 7,884,632 B2 * | 2/2011 | Shiraishi et al. ......... 324/750.25 |
| 2002/0070446 A1 * | 6/2002 | Horiuchi et al. ............. 257/723 |
| 2005/0057235 A1 * | 3/2005 | Watanabe ..................... 323/273 |

(Continued)

FOREIGN PATENT DOCUMENTS

| JP | 59154054 A * | 9/1984 |
| JP | 09229963 A * | 9/1997 |

(Continued)

OTHER PUBLICATIONS

Takehashi, Nobuitsu, machine translation of JP 09229963 A, Sep. 1997.*
Nemoto, Yoshihiko, machine translation of JP 2003174120 A, Jun. 2003.*

*Primary Examiner* — Jermele M Hollington
*Assistant Examiner* — Khristopher Yodichkas
(74) *Attorney, Agent, or Firm* — Kratz, Quintos & Hanson, LLP

(57) ABSTRACT

A probe card includes a wiring substrate including an opening portion and a connection pad arranged on an upper face of the wiring substrate located on the periphery of the opening portion, a resin portion formed in the opening portion of the wiring substrate, and the resin portion formed of a material having elasticity, a contact terminal arranged to protrude from the lower face of the resin portion, and wire buried in the resin portion and connecting the contact terminal and the connection pad, wherein the contact terminal is formed of an end part of the wire, and is formed integrally with the wire.

6 Claims, 33 Drawing Sheets

(56) References Cited

U.S. PATENT DOCUMENTS

| | | | |
|---|---|---|---|
| 2006/0109022 A1* | 5/2006 | Yoshida et al. | 324/765 |
| 2007/0228110 A1* | 10/2007 | Eldridge et al. | 228/180.5 |
| 2009/0008641 A1* | 1/2009 | Michimata et al. | 257/48 |
| 2011/0062596 A1* | 3/2011 | Murayama | H01L 21/568 257/777 |
| 2011/0281380 A1 | 11/2011 | Narizuka | |
| 2015/0022229 A1* | 1/2015 | Fukasawa et al. | 324/756.03 |
| 2015/0022230 A1* | 1/2015 | Fukasawa et al. | 324/756.03 |
| 2015/0137849 A1* | 5/2015 | Horiuchi et al. | 324/756.03 |

FOREIGN PATENT DOCUMENTS

| | | | |
|---|---|---|---|
| JP | 2001343426 A * | 12/2001 | |
| JP | 2003174120 A * | 6/2003 | |
| JP | 2011-64705 A1 | 3/2011 | |
| JP | 2011-122843 A1 | 6/2011 | |
| JP | 2011-237391 A1 | 11/2011 | |

* cited by examiner

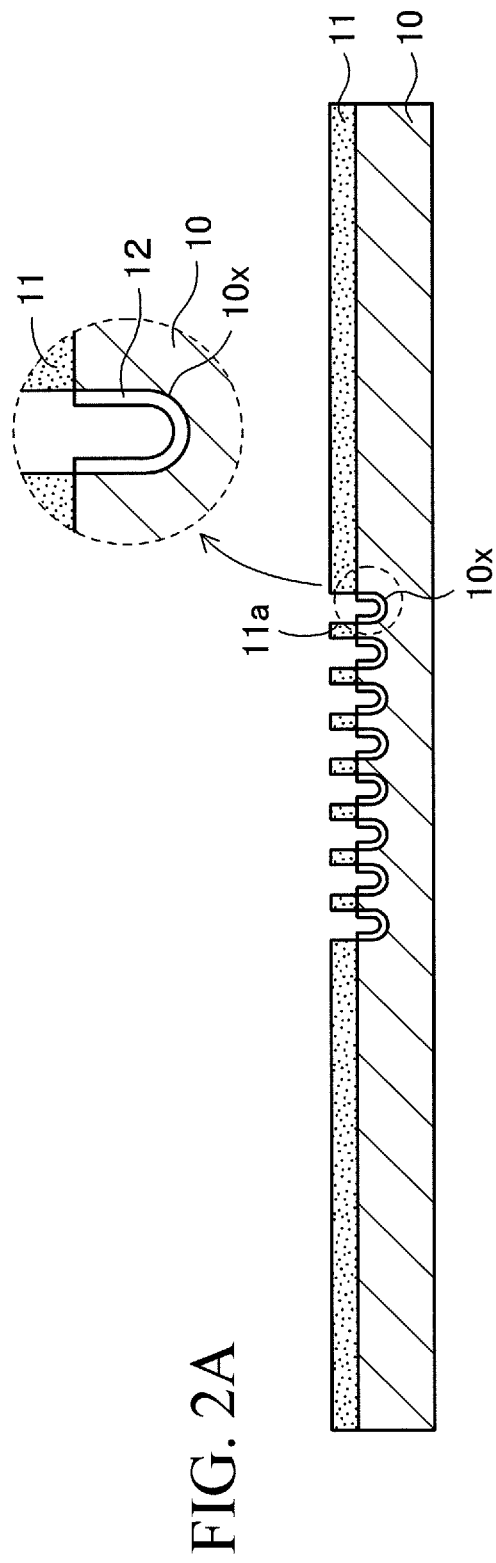
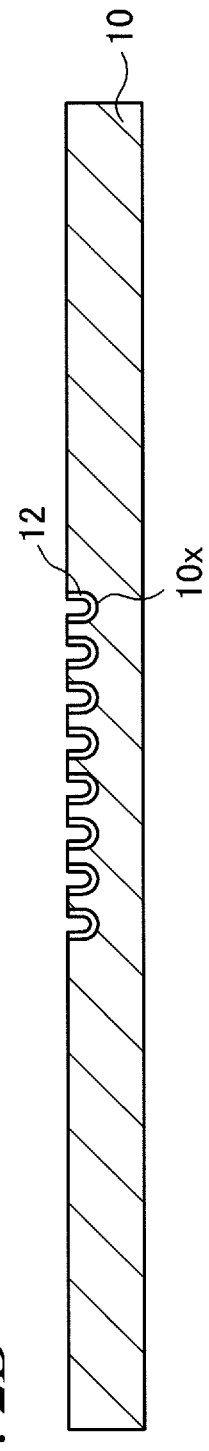
FIG. 2A
FIG. 2B (partially enlarged view)

PROBE CARD HAVING A WIRING SUBSTRATE

CROSS-REFERENCE TO RELATED APPLICATIONS

This application is based upon and claims the benefit of priority of the prior Japanese Patent Application No. 2012-243681, filed on Nov. 5, 2012, and the prior Japanese Patent Application No. 2013-129815, filed on Jun. 20, 2013, the entire contents of which are incorporated herein by reference.

FIELD

This invention is related to a probe card and a method of manufacturing the same.

BACKGROUND

Measurement of electric characteristics of a test object such as a wiring substrate or the like is performed by touching contact terminals of a probe card to many electrode pads of the test object and attaining conduction therebetween.

A related art is disclosed in Japanese Laid-open Patent Publication No. 2011-64705, Japanese Laid-open Patent Publication No. 2011-122843, and Japanese Laid-open Patent Publication No. 2011-237391.

SUMMARY

In recent years, the narrower pitch of the electrode pads of test objects is advanced. To cope with such a trend, the pitch of the contact terminals of probe cards needs to be narrower. Moreover, there has been a demand for a technique to control the contact pressure of the contact terminals of probe cards so as to avoid that the electrode pads of test objects are damaged and also the contact failure is caused.

One aspect of the following disclosure provides a probe card, including a wiring substrate including a wiring substrate including an opening portion and a connection pad arranged on an upper face of the wiring substrate located on a periphery of the opening portion, a resin portion formed in the opening portion of the wiring substrate, and the resin portion formed of a material having elasticity, a contact terminal arranged to protrude from a lower face of the resin portion, and a wire buried in the resin portion and connecting the contact terminal and the connection pad, wherein the contact terminal is formed of an end part of the wire, and is formed integrally with the wire.

Another aspect of the disclosure provides a method of manufacturing a probe card, including preparing a metal base material in which a plurality of concave portions are formed in a surface region thereof, preparing a wiring substrate including an opening portion and connection pads arranged on an upper face of the wiring substrate located on a periphery of the opening portion, adhering the wiring substrate on the metal base material such that the plurality of concave portions of the metal base material are exposed from the opening portion of the wiring substrate, connecting an inside of each of the concave portions of the metal base material and the connection pads of the wiring substrate by a wire of a wire bonding method respectively, forming a resin portion formed of a material having elasticity in the opening portion of the wiring substrate, the resin portion burying the wire, and removing the metal base material to expose a contact terminal protruding from the resin portion, wherein the contact terminal is formed of an end part of the wire.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are cross-sectional views depicting the method of manufacturing a probe card of the first embodiment (Part 2).

FIGS. 23A to 22C are cross-sectional views depicting the method of manufacturing a probe card of the fourth embodiment (Part 2).

DESCRIPTION OF EMBODIMENTS

Hereinbelow, embodiments will be explained with reference to the accompanying drawings.

First Embodiment

FIGS. 1A to 4B are views depicting a method of manufacturing a probe card of a first embodiment. FIG. 5 is a view depicting a probe card of the first embodiment. In this embodiment, the structure of the probe card will be explained, while explaining the method of manufacturing a probe card.

Figure 1A:
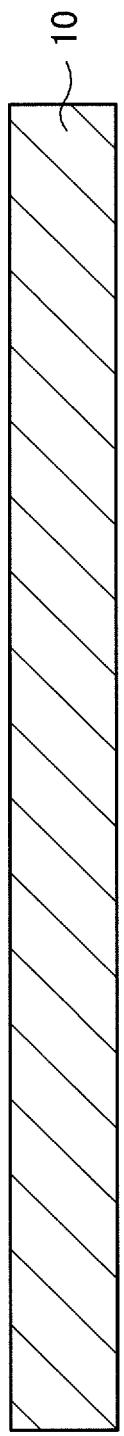
FIGS. 1A to 1C are cross-sectional views depicting a method of manufacturing a probe card of a first embodiment (Part 1).

In the method of manufacturing a probe card of the first embodiment, as depicted in FIG. 1A, first, a copper (Cu) foil 10 whose thickness is about 200 μm is prepared as a metal base material. A different metal base material such as a nickel (Ni) foil may be used instead of the copper foil 10.

Figure 1B:
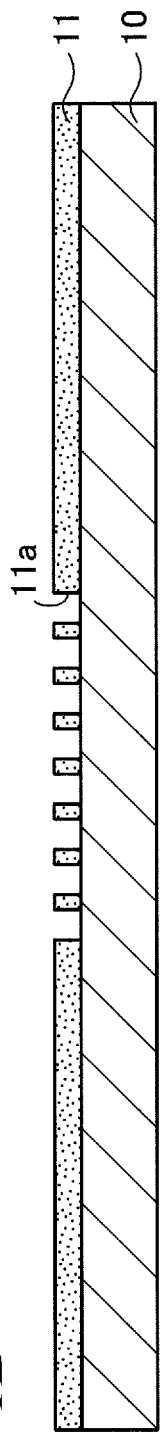
Figure 1C:
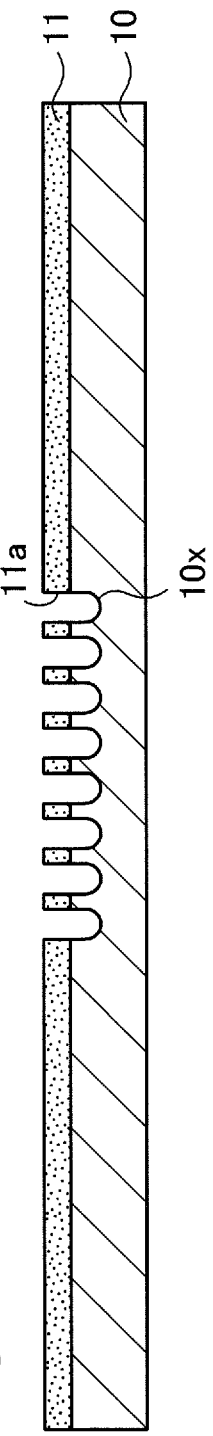

Then, as depicted in FIG. 1B, a plating resist 11 having a plurality of opening portions 11a is formed on the copper foil 10 by the photolithography, the opening portions 11a being arranged within a rectangular surface region of the copper foil 10. Further, as depicted in FIG. 1C, the copper foil 10 is wet-etched until a halfway position of the thickness through the opening portions 11a of the plating resist 11 to thereby form concave portions 10x.

By this matter, the plurality of concave portions 10x are arranged side by side within the rectangular surface region of the copper foil 10. For example, the diameter of the concave portions 10x is about 30 μm and the depth of the concave portions 10x is 20 μm to 50 μm, and the arrangement pitch of the concave portions 10x is about 40 μm.

Then, as depicted in FIG. 2A, a gold (Au) plating layer 12 whose thickness is 2 μm to 5 μm is formed on the inner face of each concave portion 10x of the copper foil 10 by electroplating utilizing the copper foil 10 as a plating power feeding path. The gold plating layer 12 is formed along the inner face of the concave portion 10x of the copper foil 10 and a hole is left inside the concave portion 10x.

Thereafter, as depicted in FIG. 2B, the plating resist 11 is removed. By this matter, the plurality of concave portions 10x in which the gold plating layer 12 is formed on the inner faces thereof respectively are arranged within the rectangular region of the surface of the copper foil 10. In this way, the copper foil 10 in which the plurality of concave portions 10x are formed within the surface region thereof is prepared.

Figure 3A:
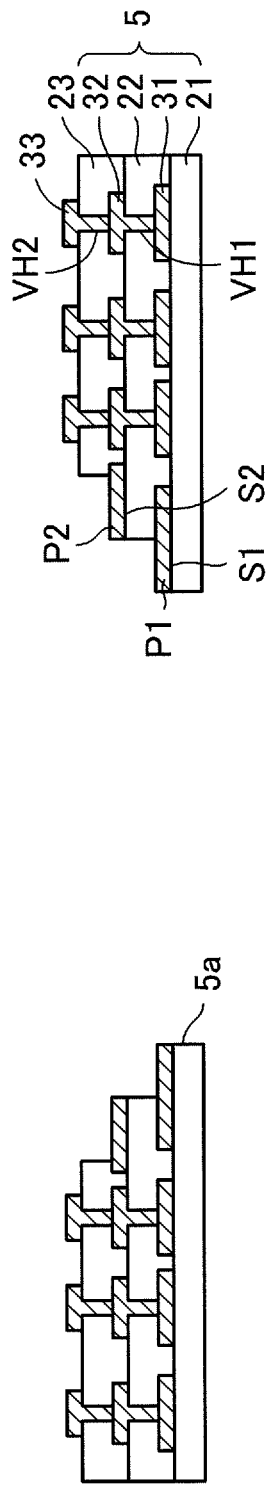
FIGS. 3A and 3B are cross-sectional views depicting the method of manufacturing a probe card of the first embodiment (Part 3).

Then, as depicted in FIG. 3A, a frame-shaped wiring substrate 5 is prepared in which an opening portion 5a penetrating in the thickness direction is provided in the center. In the wiring substrate 5, a wiring layer 31 is formed on an insulating layer 21.

An insulating layer 22 in which via holes VH1 are provided is formed on the insulating layer 21, the via holes VH1 reaching the wiring layer 31. A wiring layer 32 is formed on the insulating layer 22, the wiring layer 32 being connected to the wiring layer 31 through the via holes VH1.

Further similarly, an insulating layer 23 in which via holes VH2 are provided is formed on the insulating layer 22, the via holes VH2 reaching the wiring layer 32. A wiring layer 33 is formed on the insulating layer 23, the wiring layer 33 being connected to the wiring layer 32 through the via holes VH2.

The insulating layers 21, 22, and 23 are formed of resin or the like. The wiring layers 31, 32, and 33 are formed of copper or the like.

The side face of the opening portion 5a of the wiring substrate 5 is formed in a stepped shape. The insulating layer 21 includes a stepped face S1 of an annular shape protruding from the end of the insulating layer 22 toward an inside. Then, connection pads P1 are formed on the stepped face S1 of the insulating layer 21.

Moreover, the insulating layer 22 includes a stepped face S2 of an annular shape protruding from the end of the insulating layer 23 toward an inside. Then similarly, connection pads P2 are formed on the stepped face S2 of the insulating layer 22.

The connection pads P1 and P2 are each connected to one of the wiring layers 31 and 32. Moreover, each of the connection pads P1 and P2 includes a contact layer such as a nickel/gold plating layer on its surface.

The area of the opening portion 5a of the wiring substrate 5 is set to one size larger than the rectangular region of the copper foil 10 where the plurality of concave portions 10x are arranged as mentioned above.

As the wiring substrate 5, various wiring substrates can be used. For example, a printed wiring board in which the glass epoxy resin is utilized as the substrate may be used, by this matter, the cost reduction is attained.

In this way, the wiring substrate 5 is prepared which includes the opening portion 5a and the connection pads P1 and P2 arranged on the upper faces of the periphery of the opening portion 5a.

Figure 3B:
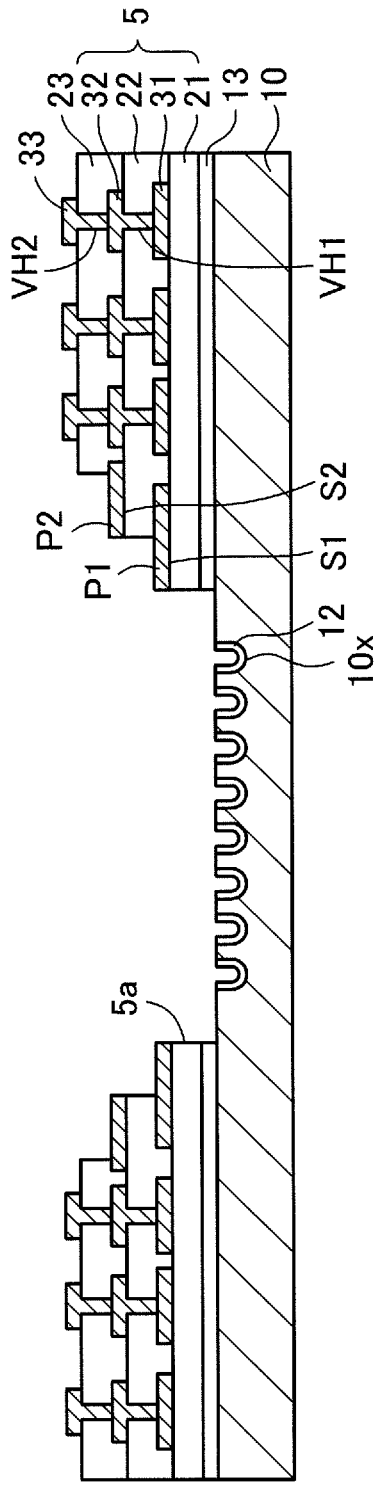

Thereafter, as depicted in FIG. 3B, the lower face of the wiring substrate 5 in FIG. 3A is adhered onto the copper foil 10 with an adhesive layer 13. By this matter, It is in a state that the plurality of concave portions 10x of the copper foil 10 are exposed collectively within the opening portion 5a of the wiring substrate 5. As the adhesive layer 13, an epoxy resin-based adhesive sheet, an epoxy resin-based liquid adhesive, or the like is used, for example.

Figure 4A:
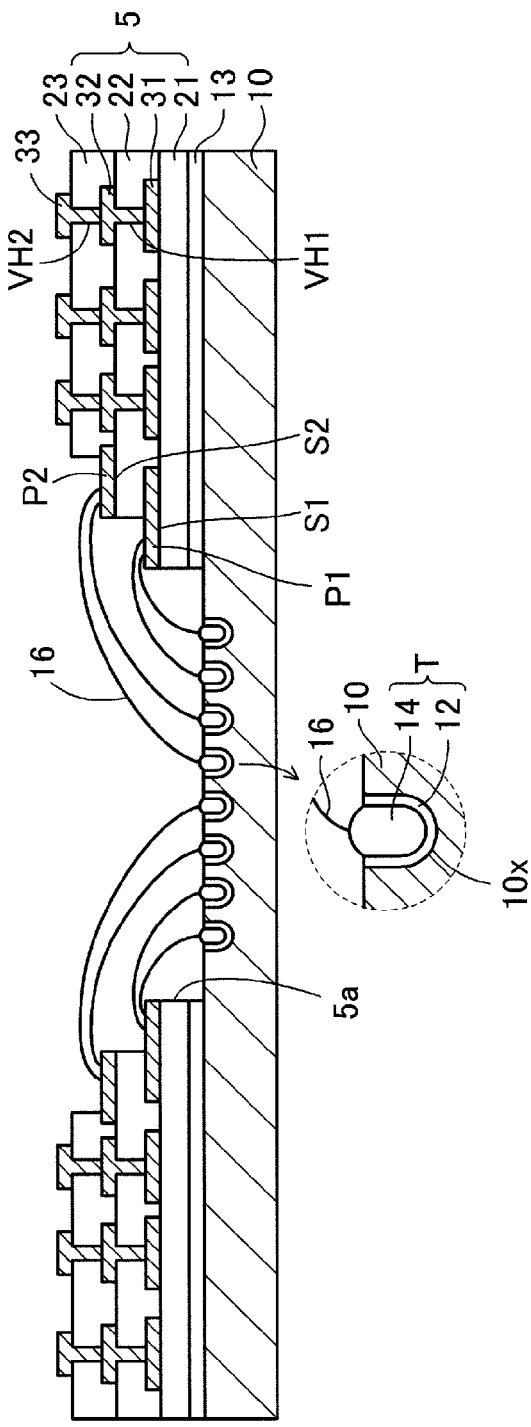
FIGS. 4A and 4B are cross-sectional views depicting the method of manufacturing a probe card of the first embodiment (Part 4).
Figure 5:
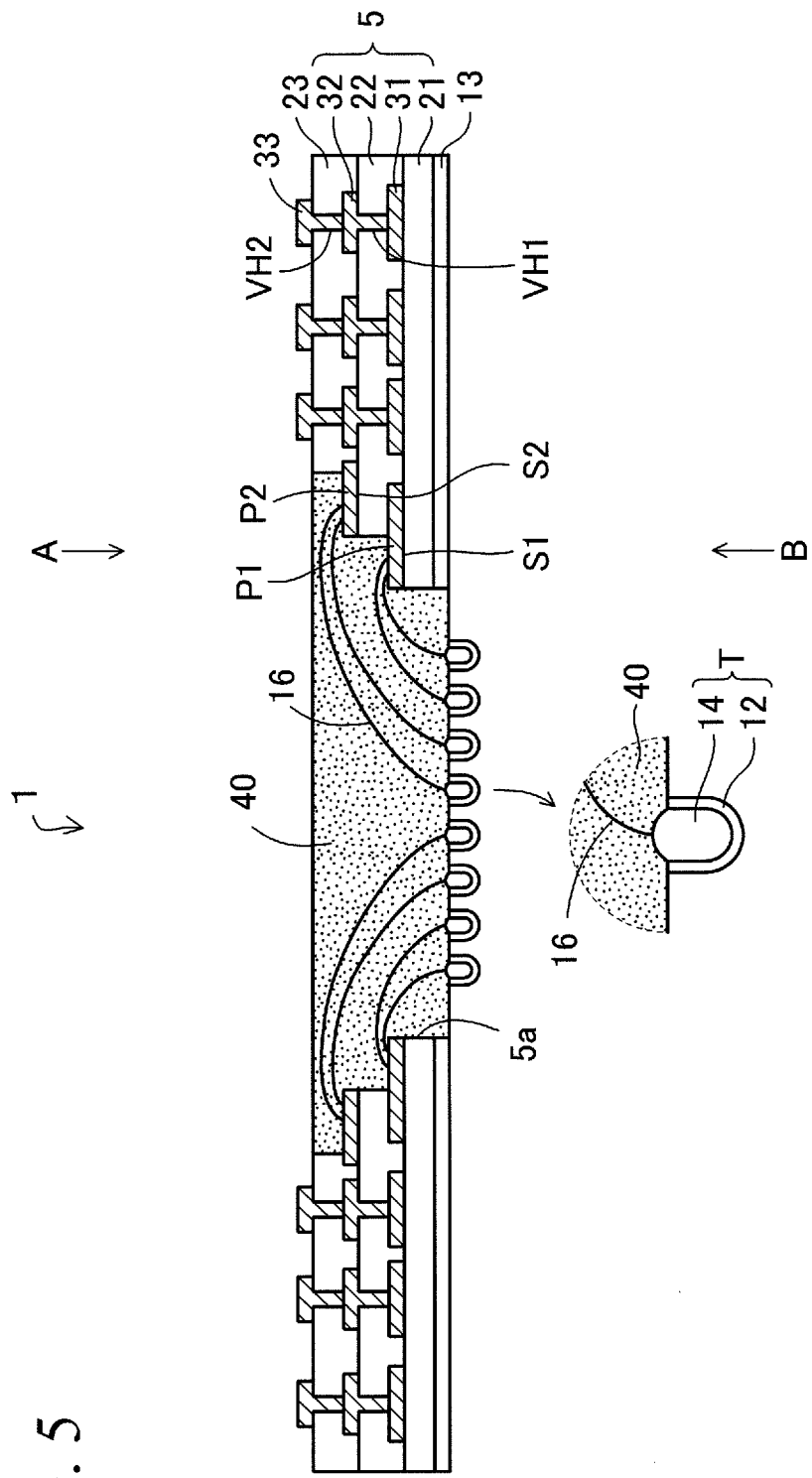
FIG. 5 is a cross-sectional view depicting a probe card of the first embodiment.

Then, as depicted in FIG. 4A, on the basis of the wire bonding, a tip part of a gold wire 16 protruded from the capillary (not depicted) of a wire bonder is rounded into a ball shape by the electric discharge. Then the capillary is lowered, and the ball-shaped tip part of the gold wire 16 is touched to the gold plating layer 12 in the concave portions 10x of the copper foil 10, and the ball-shaped tip part is bonded to the gold plating layer 12 by heating and ultrasonic vibration.

Thereafter, the capillary is raised, and the gold wire 16 is moved to the connection pads P1 of the wiring substrate 5, and the gold wire 16 and the connection pad P1 are bonded.

In this way, the inside of the concave portion 10x of the copper foil 10 and the connection pad P1 of the wiring substrate 5 are connected by the gold wire 16. By this matter, the concave portion 10x of the copper foil 10 is filled with the gold plating layer 12 and a gold electrode 14 from the wire bonder, thus a contact terminal T of a probe card is obtained from the gold plating layer 12 and the gold electrode 14. At this point, it is in a state that the contact terminal T of the probe card is buried in the copper foil 10.

The contact terminal T is electrically connected to the connection pad P1 of the wiring substrate 5 through the gold wire 16 connected thereto.

A similar wire bonding process is repeated. By this matter, the contact terminals T are formed in all the concave portions 10x of the copper foil 10, and also each contact terminal T is electrically connected to one of the connection pads P1 and P2 of the wiring substrate 5 through the gold wire 16.

The number of stepped faces of the wiring substrate 5 is adjusted according to the number of contact terminals T. In this embodiment, the connection pads P1 and P2 are arranged on the two stepped faces S1 and S2 respectively. However, the number of connection pads can be increased by increasing the number of steps in accordance with the number of contact terminals T.

In this embodiment, the arrangement pitch of the contact terminals T is determined by the limit specification of the wire bonding technique. In the case of using a wire whose diameter is 18 μm, the arrangement pitch of the wire can be set to about 40 μm, and can be made to the narrower pitch. Also, in the case of using a wire whose diameter is 15 μm, the arrangement pitch of wire can be set to about 35 μm, and can be further made to the narrower pitch.

In this embodiment, in order to reliably filling the gold electrode 14 in the concave portion 10x of the copper foil 10 by wire bonding, after the gold plating layer 12 is formed on the concave portion 10x of the copper foil 10, the gold electrode 14 is formed. Alternatively, it is possible to omit the gold plating layer 12 and form the gold electrode 14 directly in the concave portion 10x of the copper foil 10 by wire bonding. In this case, the contact terminal T is formed only the gold electrode 14.

Moreover, the gold electrode 14 is illustrated as an example of a metal electrode to be buried in each concave portion 10x of the copper foil 10. Instead of the gold wire 16, a copper wire may be used, and a copper electrode may be buried on gold plating layer 12 in concave portion 10x of the copper foil 10.

Figure 4B:
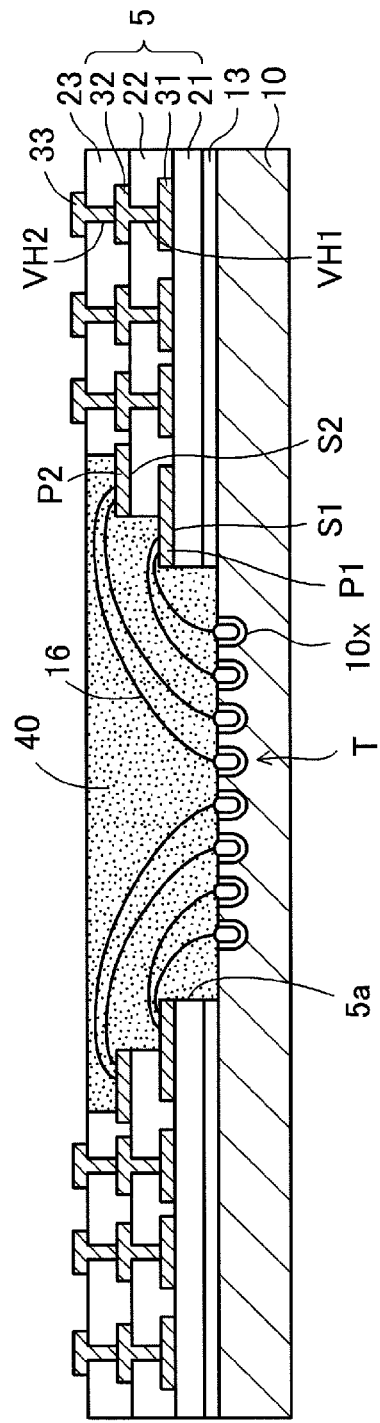

Then, as depicted in FIG. 4B, low-viscosity liquid resin is coated into the opening portion 5a of the wiring substrate 5 in which the plurality of gold wires 16 are arranged, to fill the inside of the opening portion 5a with the liquid resin. Thereafter, the liquid resin is cured by a heating process to bury the plurality of gold wires 16 in a resin portion 40.

The resin portion 40 is formed of a resin material having elasticity or a rubber material. As one preferred example, a material having a Young's modulus of 1 MPa to 10 MPa such as a silicone-based low-elasticity resin or a fluororubber may be used. Alternatively, a low-elasticity acrylic resin, an urethane rubber, or the like may be used.

Then, as depicted in FIG. 5, the copper foil 10 is removed by wet etching. As the etchant for the copper foil 10, an iron(III) chloride aqueous solution, a copper(II) chloride aqueous solution, or the like is available. By this matter, the copper foil 10 can be selectively removed from the gold plating layer 12 of each contact terminal T, the resin portion 40, and the adhesive layer 13. In this way, the plurality of contact terminals T each formed of a gold plating layer 12 and a gold electrode 14 are obtained on the lower face of the resin portion 40.

Alternatively, in the case that a nickel foil is used instead of the copper foil 10, as the etchant, a mixed solution of aqueous hydrogen peroxide and nitric acid or the like is used. In this way, selective removal to the base can likewise be performed.

As examples of the metal base material, the coil foil 10 and a nickel foil are illustrated. It is possible to use a different metal material as long as it is a metal which can be selectively removed from the contact terminals T, the resin portion 40, and the adhesive layer 13.

By the above steps, as depicted in FIG. 5, a probe card 1 of the first embodiment is obtained.

As depicted in FIG. 5, the probe card 1 of the first embodiment includes the frame-shaped wiring substrate 5 in which the opening portion 5a is provided in the center, which is explained in FIG. 3A mentioned above.

The side face of the opening portion 5a of the wiring substrate 5 is in a stepped shape and has the stepped face S1 and the stepped face S2 in this order from below. The connection pads P1 are formed on the stepped face S1, and the connection pads P2 are formed on the stepped face S2. In this way, the wiring substrate 5 includes the connection pads P1 and P2 on the upper faces of the periphery of the opening portion 5a.

Figure 6A:
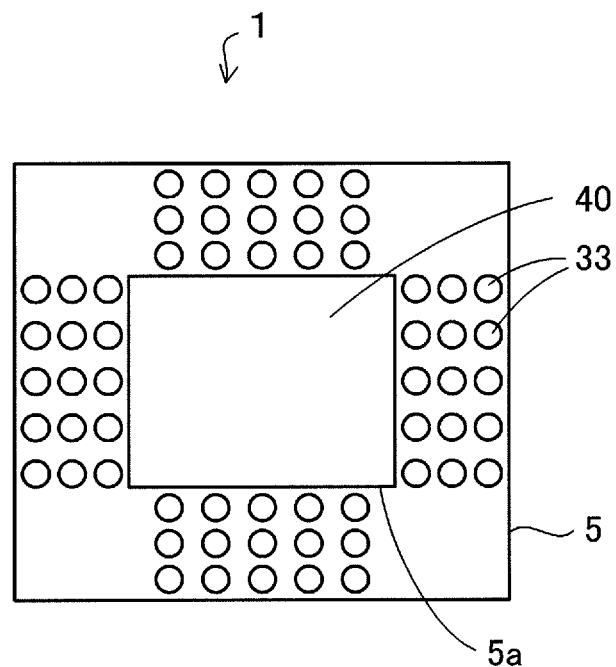
FIG. 6A is a reduced plan view of the probe card in FIG. 5 as seen from above.
Figure 6B:
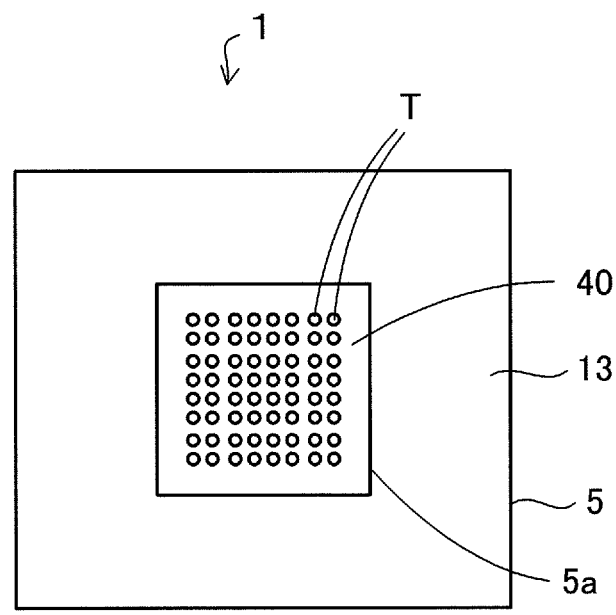
FIG. 6B is a reduced plan view of the probe card in FIG. 5 as seen from below.

FIG. 6A is a reduced plan view of FIG. 5 as seen from an upper face side A. FIG. 6B is a reduced plan view of FIG. 5 as seen from a lower face side B.

Referring to FIG. 6A in addition, the resin portion 40 is filled in the rectangular opening portion 5a in the center of the wiring substrate 5. In the example of FIG. 6A, a plurality of wiring layer 33 of a pad shape are arranged side by side in the annular region on the upper face of the wiring substrate 5.

Further, referring to FIG. 6B in addition, the plurality of connection terminals T each formed of a gold plating layer 12 and a gold electrode 14 are arranged side by side on the lower face of the resin portion 40 filled in the opening portion 5a of the wiring substrate 5. The gold plating layer 12 of each contact terminal T is formed by electroplating, and the gold electrode 14 thereof is formed by wire bonding.

The gold plating layer 12 may be omitted, and the contact terminal T may be formed only the gold electrode 14.

Further, as depicted in FIG. 5, each contact terminal T is electrically connected to one of the connection pads P1 and P2 of the wiring substrate 5 through the gold wire 16. Each gold wire 16 is buried in the resin portion 40 and held by the resin portion 40. The number of stepped faces that the connection pads of the wiring substrate 5 are arranged is adjusted as appropriate according to the number of contact terminals T.

The resin portion 40 is formed of a silicone-based low-elasticity resin, a fluororubber, or the like and has moderate elasticity. Each gold wire 16 is wired inside the resin portion 40, and the contact terminal T arranged at the tip of the gold wire 16 is exposed to protrude from the lower face of the resin portion 40. By this matter, by pressing the resin portion 40 having the elasticity downward, moderate contact pressure can be applied to each contact terminal T.

Meanwhile, the probe card 1 of this embodiment can be manufactured by using techniques which can be carried out in conventional factory lines such as printed wiring boards, wire bonding techniques, resin sealing, and wet etching of a copper foil. Thus, the probe card can be manufactured at a good yield and at a low cost.

Next, a method of measuring electric characteristics of a test object by using the probe card 1 of the first embodiment will be explained.

Figure 7:
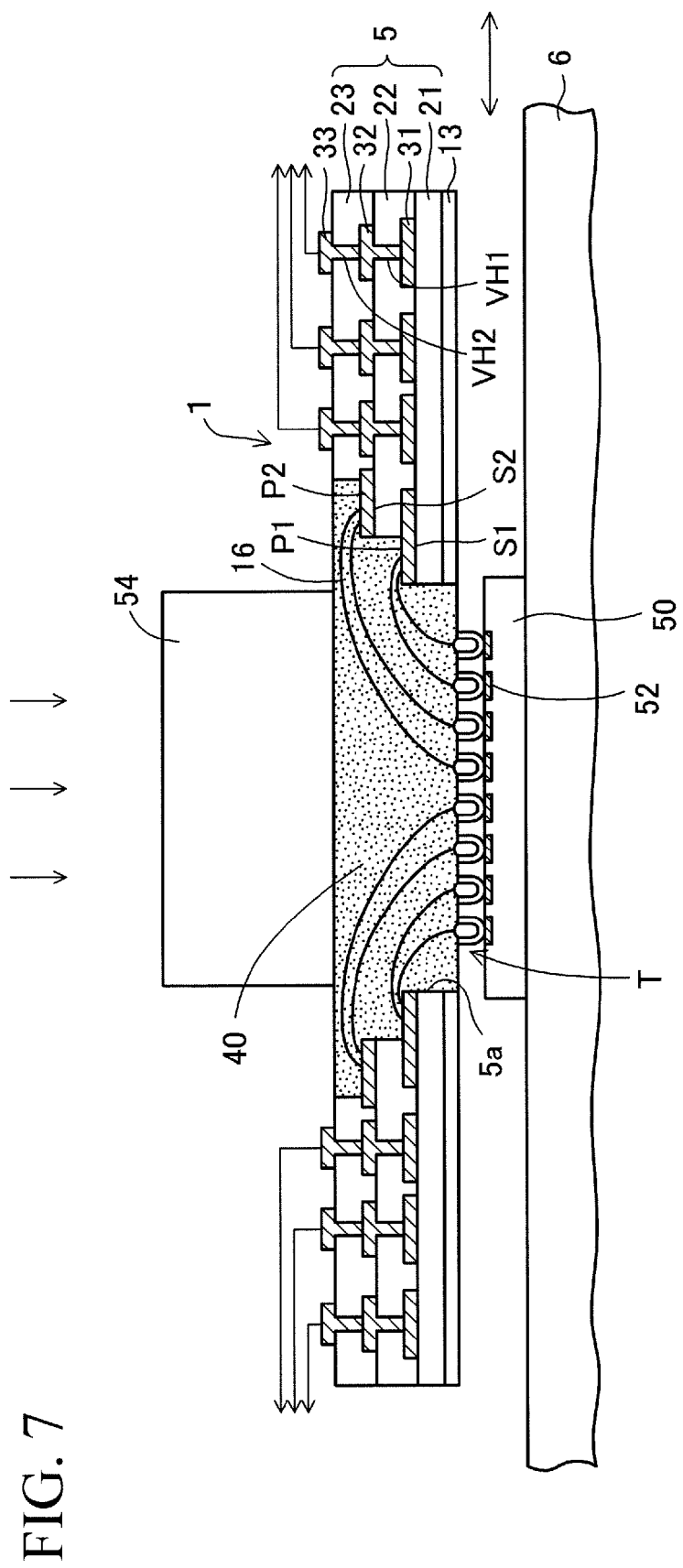
FIG. 7 is a cross-sectional view depicting a state that electric characteristics of a wiring substrate are measured by the probe card in FIG. 5.

As depicted in FIG. 7, terminals of a testing device (not depicted) such as an measuring instrument or the like are electrically connected to the wiring layers 33 (pads) of the probe card 1. The testing device supplies various test signals to a test object through the probe card 1, and the electric characteristics of the test object is measured.

FIG. 7 illustrates an example of measuring the electric characteristics of a wiring substrate such as an interposer or the like. The probe card 1 is arranged on the wiring substrate 50 such that the contact terminals of the probe card 1 are touched to the electrode pads 52 of the measuring wiring substrate 50 arranged on a stage 6.

Further, a pressing mechanism 54 is arranged on the resin portion 40 of the probe card 1, and the resin portion 40 is pressed downward. The pressing force of the pressing mechanism 54 is detected by load detecting device such a load cell or the like and is adjusted.

As mentioned above, the resin portion 40 has moderate elasticity. Therefore, as following the pressing force from the pressing mechanism 54, all the contact terminals T can be pressed toward the electrode pads 52 of the wiring substrate 50 at moderate contact pressure.

In this way, the probe card 1 of this embodiment includes the pressing mechanism 54 for adjusting the contact pressure of the contact terminals T. By this matter, on the basis of supplying the electric current from the testing device to the wiring substrate 50, the electrical testing such as measuring of the resistance value in the wiring substrate 50 or the like can be performed reliably.

By providing a moving mechanism (not depicted) to the probe card 1, and moving and scanning the probe card 1 horizontally over the surface of the test object, testing can be performed quickly even when measuring the test object having many testing points.

Moreover, the probe card 1 of this embodiment can measure the resistance value of the wiring substrate 50 by four-terminal testing. In the case of general two-terminal testing, the measurement value includes the wiring resistance of the probe card 1, and the contact resistance between the contact terminal T and the electrode pad 52 of the wiring substrate 50. Accordingly it is difficult to accurately measure the resistance value of only the wiring substrate 50.

However, by employing four-terminal testing, since the circuit in which the electric current is caused to flow and the circuit in which the voltage is measured are independent each other, the wiring resistance and the contact resistance can be ignored. Accordingly, the resistance value of the wiring substrate 50 can be measured accurately.

Figure 8:
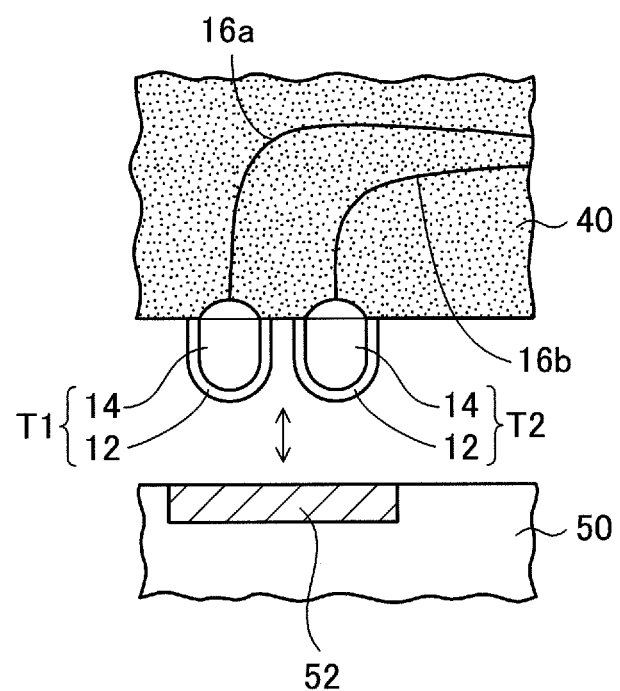
FIG. 8 is a cross-sectional view depicting a state of contact terminals of a probe card corresponding to four-terminal testing in the first embodiment.

As depicted in FIG. 8, the probe card 1 of this embodiment is designed so as to corresponding to the four-terminal testing. A pair of the contact terminal T1 connected to the wire 16a and the contact terminal T2 connected to the wire 16b are connected to one electrode pad 52 of the wiring substrate 50 in a state that the contact terminals T1, T2 are separated each other. For example, the circuit to be connected to the contact terminal T1 is the current supplying circuit, while the circuit to be connected to the contact terminal T2 is the voltage measuring circuit.

Figure 9A:
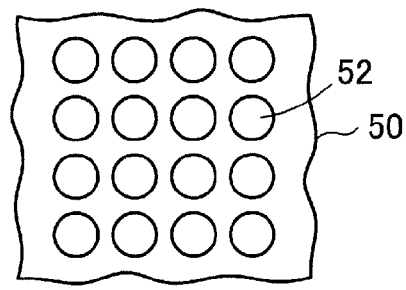
FIGS. 9A to 9E are plan views depicting a state of connection pads of a wiring substrate and the contact terminals of the probe card according to four-terminal testing (Part 1).

FIG. 9A illustrates a first example of the arrangement of the electrode pads 52 of the wiring substrate 50. In FIG. 9A, the plurality of electrode pads 52 are arranged with a lattice arrangement in which the patterns are aligned on straight lines in the lateral direction and vertical direction.

Figure 9B:
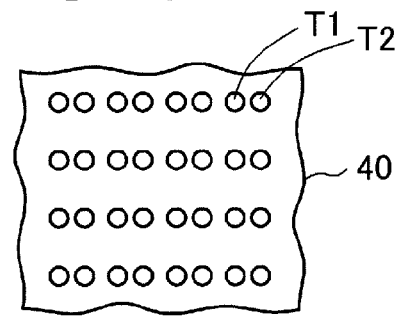
Figure 9C:
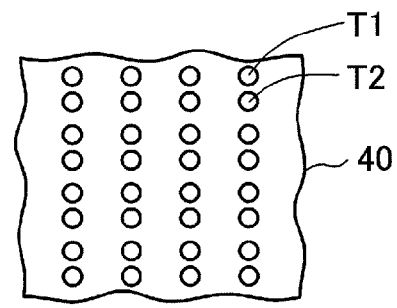

The pair of contact terminals T1 and T2 of the probe card 1 in FIG. 8 to be arranged on each electrode pad 52 of the wiring substrate 50 in FIG. 9A may be arranged side by side in the lateral direction as depicted in FIG. 9B or arranged side by side in the vertical direction as depicted in FIG. 9C.

Figure 9D:
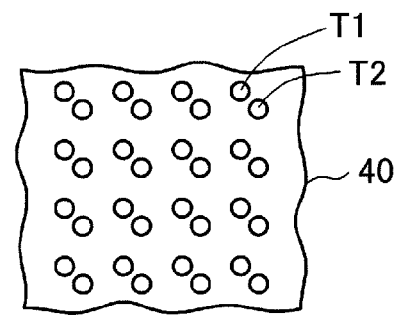
Figure 9E:
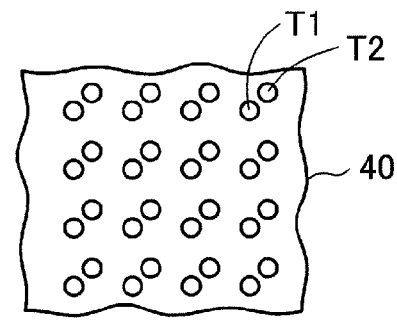

Alternatively, as depicted in FIG. 9D, the pair of contact terminals T1 and T2 of the probe card 1 in FIG. 8 may be arranged side by side diagonally upward and leftward, or as depicted in FIG. 9E, may be arranged side by side diagonally upward and rightward.

Figure 10A:
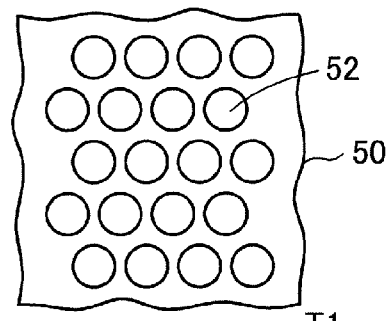
FIGS. 10A to 10E are plan views depicting a state of the connection pads of the wiring substrate and the contact terminals of the probe card according to four-terminal testing (Part 2).

Moreover, FIG. 10A illustrates a second example of the arrangement of the electrode pads 52 of the wiring substrate 50. In FIG. 10, the plurality of electrode pads 52 are arranged with a staggered arrangement in which the patterns are aligned alternately at the half position of the pitch between the pads.

Figure 10B:
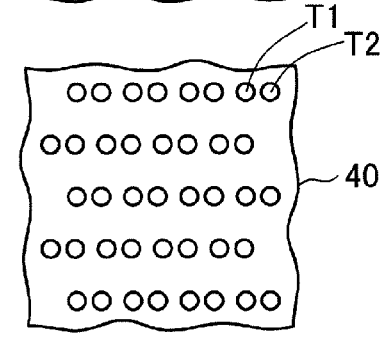
Figure 10C:
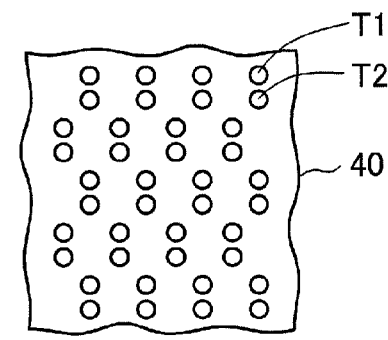

In this case, similarly, the pair of the contact terminals T1 and T2 of the probe card 1 in FIG. 8 may be arranged side by side in the lateral direction as depicted in FIG. 10B, or may be arranged side by side in the vertical direction as depicted in FIG. 10C.

Figure 10D:
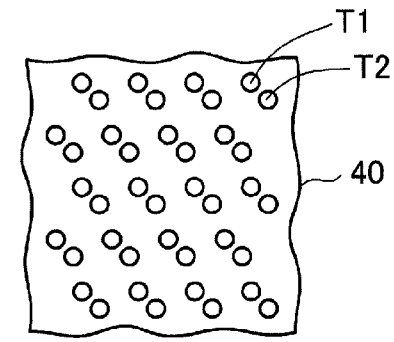
Figure 10E:
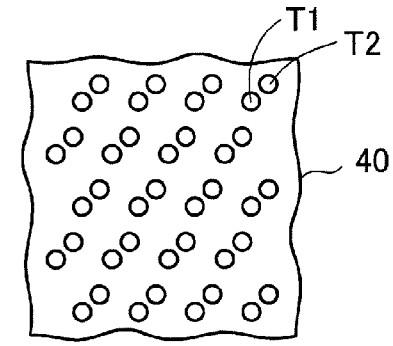

Alternatively, the pair of the contact terminals T1 and T2 of the probe card 1 in FIG. 8 may be arranged side by side diagonally upward and leftward as depicted in FIG. 10D, or may be arranged side by side diagonally upward and rightward as depicted in FIG. 10E.

Figure 11:
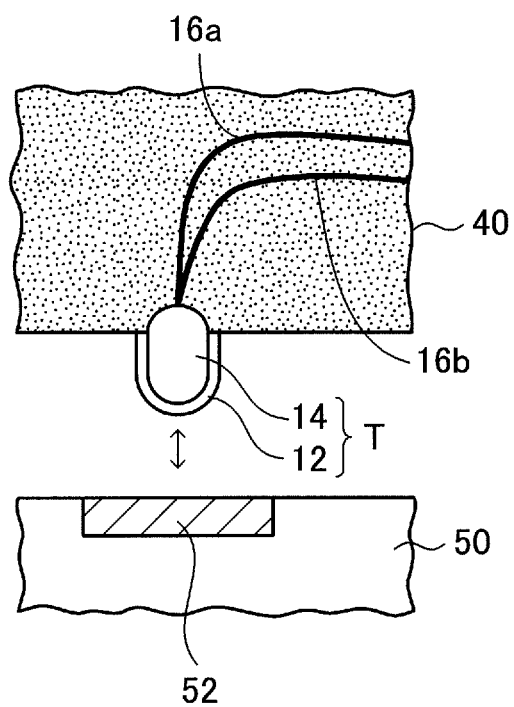
FIG. 11 is a cross-sectional view depicting a state of a contact terminal of a probe card corresponding to pseudo four-terminal testing in the first embodiment.

Moreover, as depicted in FIG. 11, one contact terminal T of the probe card 1 may be touched to one electrode pad 52 of the wiring substrate 50, and a wire 16a and a wire 16b separated from each other may be connected to that one contact terminal T. For example, the wire 16a serves as the current supplying circuit, while the wire 16b serves as the voltage measuring circuit.

In this way, two wires which are separated each other may be connected to one contact terminal of the probe card.

In this case, the current circuit and the voltage circuit are shared at the contact terminal T, so that pseudo four-terminal testing is performed and therefore the contact resistance between the contact terminal T and the electrode pad 52 of the wiring substrate 50 is included. Nonetheless, the pseudo four-terminal testing can be performed more accurately than two-terminal testing.

Note that this embodiment illustrates the wiring substrate 50 such as an interposer or the like as an example of the test object. The probe card 1 can be used for electrical testing of various other electronic components such as a semiconductor substrate such as a silicon wafer in which the semiconductor circuits are formed, or a module board in which the semiconductor chip is mounted on the wiring substrate, or the like.

Moreover, this embodiment illustrates that the contact terminals T of the probe card 1 are arranged with the area-array type. Alternatively, the contact terminals T of the probe card 1 are arranged with the peripheral arrangement type in which the contact terminals T are arranged only at the periphery.

Second Embodiment

FIGS. 12A to 13B are views depicting a method of manufacturing a probe card of a second embodiment. FIG. 14 is a view depicting a probe card of the second embodiment. In the second embodiment, a resin portion protrudes outward from a wiring substrate, and contact terminals are arranged on the protruding portion of the resin portion.

Figure 12A:
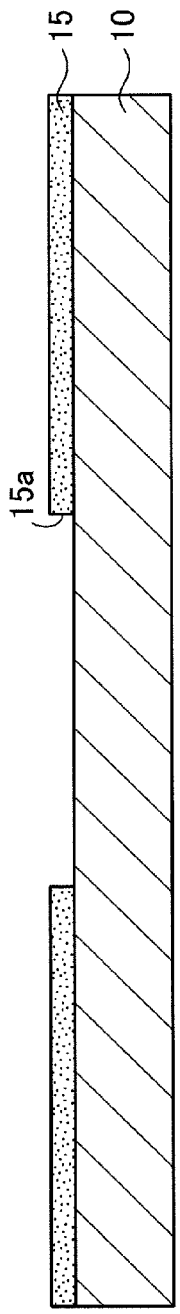
FIGS. 12A to 12C are cross-sectional views depicting a method of manufacturing a probe card of a second embodiment (Part 1).

In the method of manufacturing a probe card of the second embodiment, as depicted in FIG. 12A, first, a copper foil 10 similar to that in the first embodiment is prepared. Then, a resist 15 in which the opening portion 15a is provided is formed on the copper foil 10 on the basis of the photolithography, the opening portion 15a being provided collectively in a rectangular region of the copper foil 10 in which the plurality of concave portions 10x are to be arranged, explained in the first embodiment.

Figure 12B:
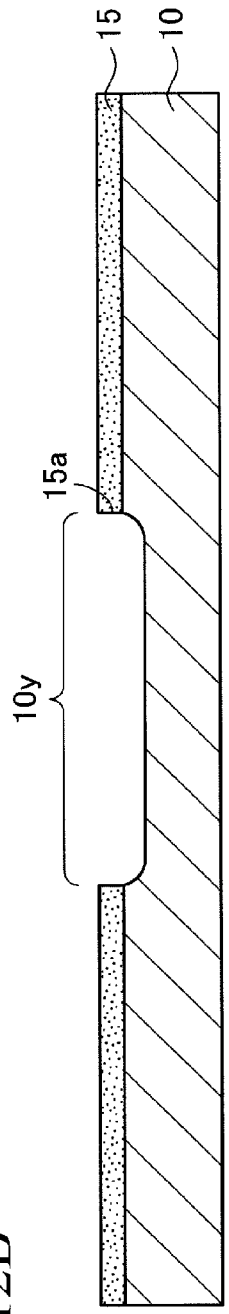

Thereafter, as depicted in FIG. 12B, the rectangular region of the copper foil 10 is etched until a halfway position of the thickness through the opening portion 15a of the resist 15 to thereby form a concave region 10y. In the case that the thickness of the copper foil 10 is about 200 µm, the depth of the concave region 10y of the copper foil 10 is set to about 100 µm to 150 µm.

Figure 12C:
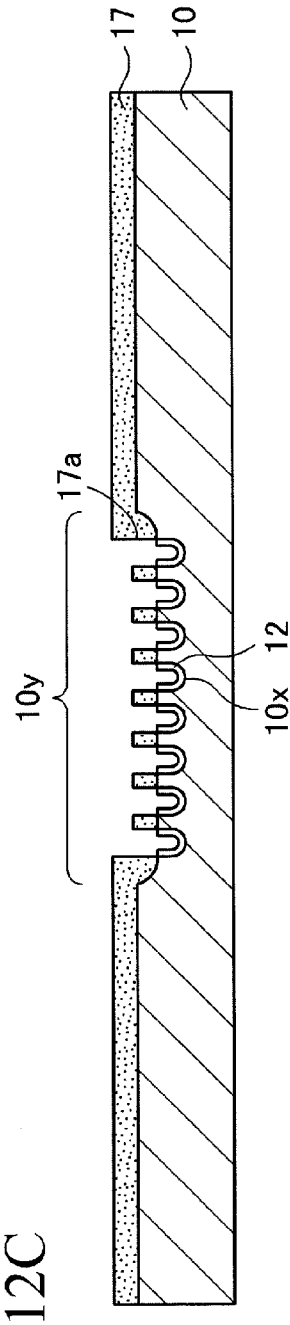

Then, as depicted in FIG. 12C, the resist 15 is removed, and thereafter a resist 17 in which a plurality of opening portions 17 are arranged in the concave region 10y of the copper foil 10, is formed on the copper foil 10 on the basis of the photolithography.

Subsequently, as depicted in FIG. 12C likewise, the copper foil 10 is wet-etched until a halfway position of the thickness through the opening portions 17a of the resist 17 to thereby form the plurality of concave portions 10x. Further, as depicted in FIG. 12C likewise, the gold plating layer 12 is formed on the inner face of the plurality of concave portion 10x by electroplating similarly to the step in the FIG. 2A of the first embodiment.

Figure 13A:
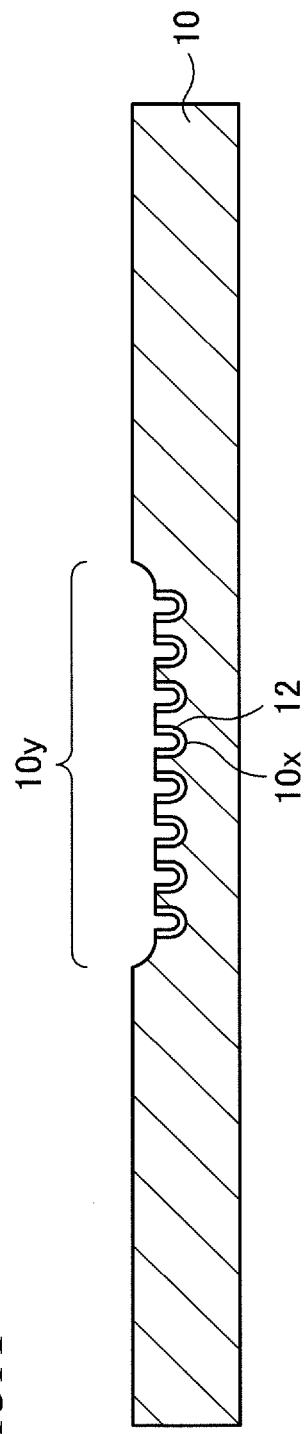
FIGS. 13A and 13B are cross-sectional views depicting the method of manufacturing a probe card of the second embodiment (Part 2).
Figure 14:
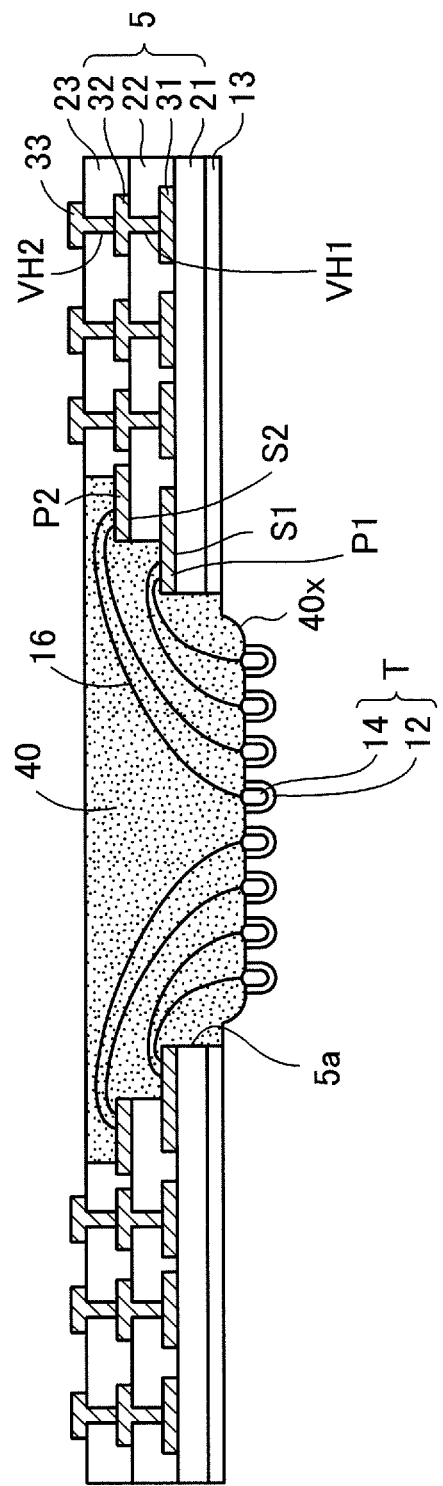
FIG. 14 is a cross-sectional view depicting a probe card of the second embodiment.

Thereafter, as depicted in FIG. 13A, the resist 17 is removed. By this matter, it is in a state that the plurality of concave portions 10x in which the gold plating layer 12 is formed on the inner face thereof respectively are arranged in the concave region 10y of the copper foil 10.

Figure 13B:
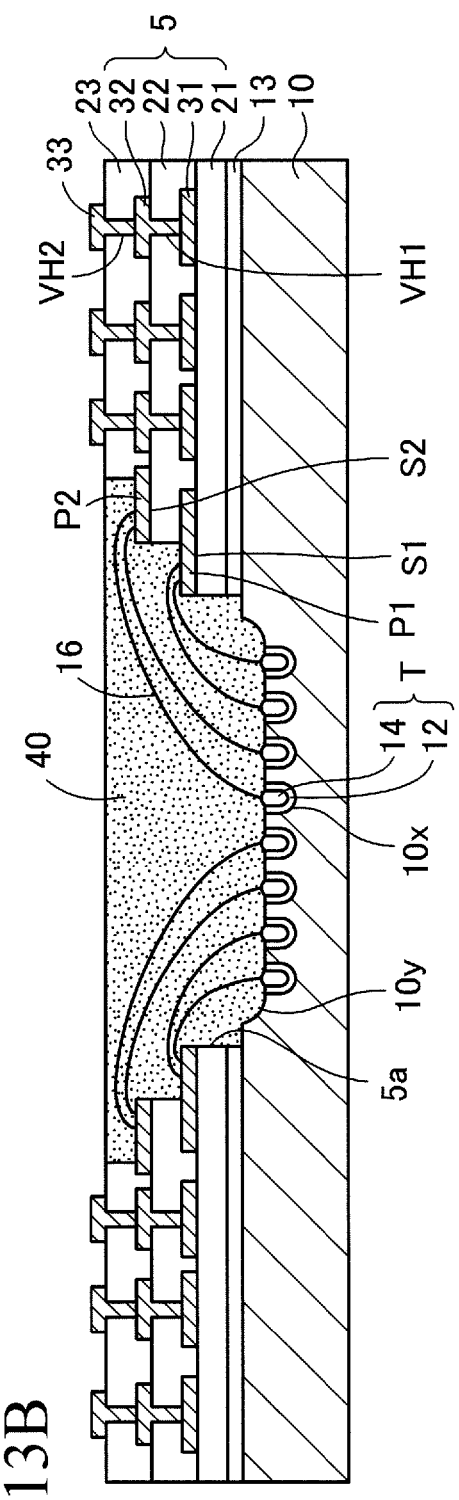

Then, as depicted in FIG. 13B, by using a similar method to the step in FIGS. 3A and 3B in the first embodiment, the wiring substrate 5 in which the opening portion 5a is provided in the center is adhered onto the copper foil 10 by the adhesive layer 13.

Thereafter, as depicted in FIG. 13B likewise, similarly to the step in FIG. 4A in the first embodiment, the gold electrode 14 is bonded to the gold plating layer 12 in each concave portion 10x of the copper foil 10, and the gold electrode 14 and the connection pad P1 or P2 of the wiring substrate 5 are connected by the gold wire 16. By this matter, the contact terminal T is obtained in each concave portion 10x of the copper foil 10.

Further, as depicted in FIG. 13B likewise, similarly to the step in FIG. 4B in the first embodiment, the resin portion 40 is formed in the opening portion 5a of the wiring substrate 5 to bury the gold wires 16 inside the resin portion 40.

Thereafter, as depicted in FIG. 14, similarly to the step in FIG. 5 in the first embodiment, the copper foil 10 is removed to expose the contact terminals T.

By the above steps, as depicted in FIG. 14, a probe card 2 of the second embodiment is obtained.

As depicted in FIG. 14, in the probe card 2 of the second embodiment, the resin portion 40 includes a protruding portion 40x protruding downward from the adhesive layer 13 on the lower face of the wiring substrate 5.

Then, the plurality of contact terminals T are arranged on the exposed face of the protruding portion 40x of the resin portion 40. The height of protrusion of the protruding portion 40x of the resin portion 40 can be adjusted by the thickness and etching amount of the copper foil 10 in the step in FIG. 12B.

The other features of the structure are the same as those of the probe card 1 of the first embodiment, therefore the explanation thereof is omitted.

Figure 15:
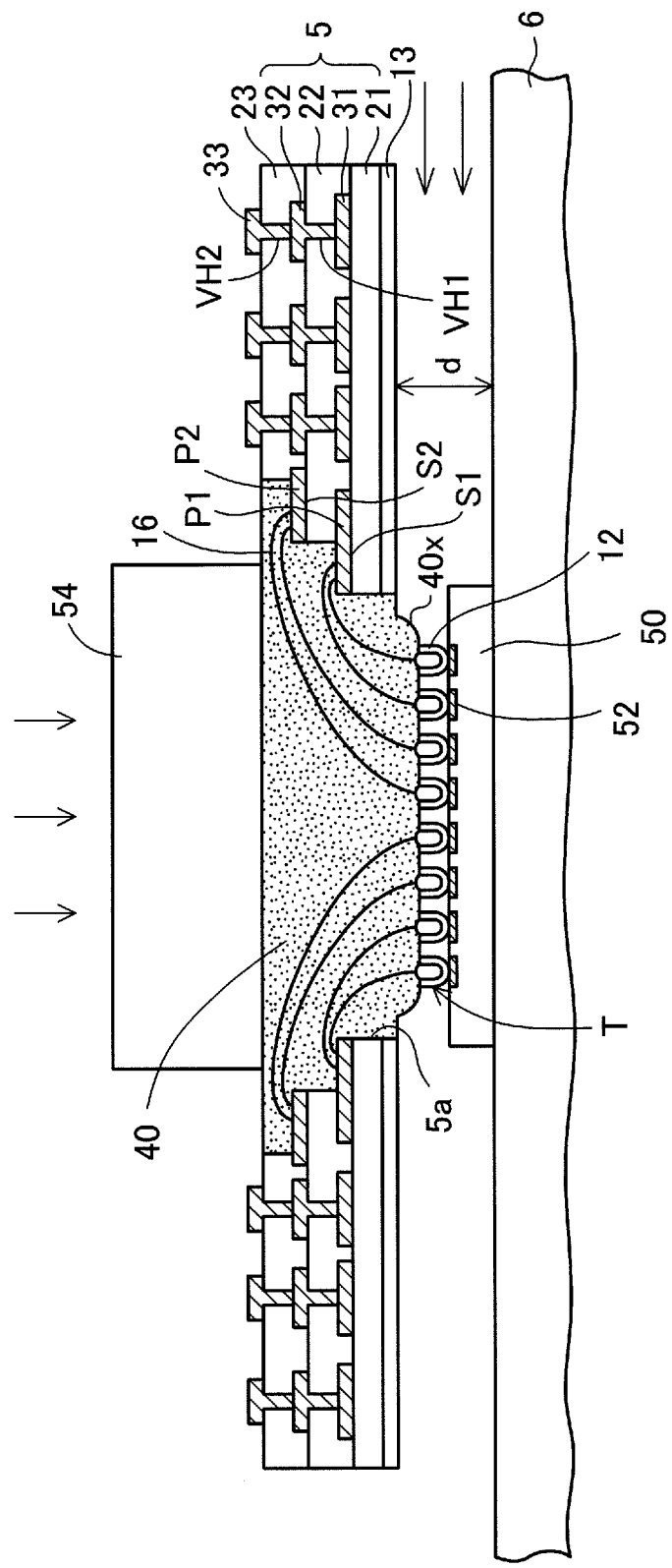
FIG. 15 is a cross-sectional view depicting a state that electric characteristics of a wiring substrate are measured by the probe card in FIG. 14.

As depicted in FIG. 15, similarly to the first embodiment, the probe card 2 of the second embodiment is arranged on the wiring substrate 50, and electric characteristics of the wiring substrate 50 are measured in a state that the probe card 2 is pressed downward by the pressing mechanism 54.

In the probe card 2 of the second embodiment, since the contact terminals T are arranged on the protruding portion 40x of the resin portion 40, a gap d between a stage 6 and the wiring substrate 5 can be widened more than that in the first embodiment.

By this matter, the light is irradiated to the region where the contact terminals T are arranged from between the stage 6 and the probe card 2. By doing so, the condition of contact of the contact terminals T can be easily checked by the eyes or the image recognition.

Also, when the electric characteristics are measured, in order to improve the condition of contact between the contact terminals T of the probe card 2 and the measuring wiring substrate 50, for example, there is a case to increase the load of the pressing mechanism 54.

At this time, like the probe card 1 of the first embodiment, in the case of a structure in which the lower face of the resin portion 40 and the lower face of the wiring substrate 5 are flush, there is a fear that the lower face of the wiring substrate 5 of the probe card 2 touches the measuring wiring substrate 50.

However, in the second embodiment, the wiring substrate 5 of the probe card 2 is arranged further away from the measuring wiring substrate 50 due to the presence of the protruding portion 40x of the resin portion 40. In addition, by including the protruding portion 40x of the resin portion 40, even when the load of the pressing mechanism 54 is increased, the load can be suppressed to a low level by the elasticity of the protruding portion 40x.

For this reason, the condition of contact of the contact terminals T can be improved with no contact between the wiring substrate 5 of the probe card 2 and the measuring wiring substrate 50, and therefore the electric characteristics can be measured stably.

The probe card 2 of the second embodiment brings about advantageous effects similar to those of the first embodiment.

Third Embodiment

FIGS. 16 to 20 are views depicting a method of manufacturing a probe card of a third embodiment. FIG. 21 is a view depicting a probe card of the third embodiment.

The third embodiment differs from the first and second embodiments in that gold wires connected to contact terminals are formed in a coaxial structure. In the third embodiment, the same steps and elements as those in the first embodiment will be denoted by the same reference signs, and specific explanation thereof will be omitted.

Figure 16:
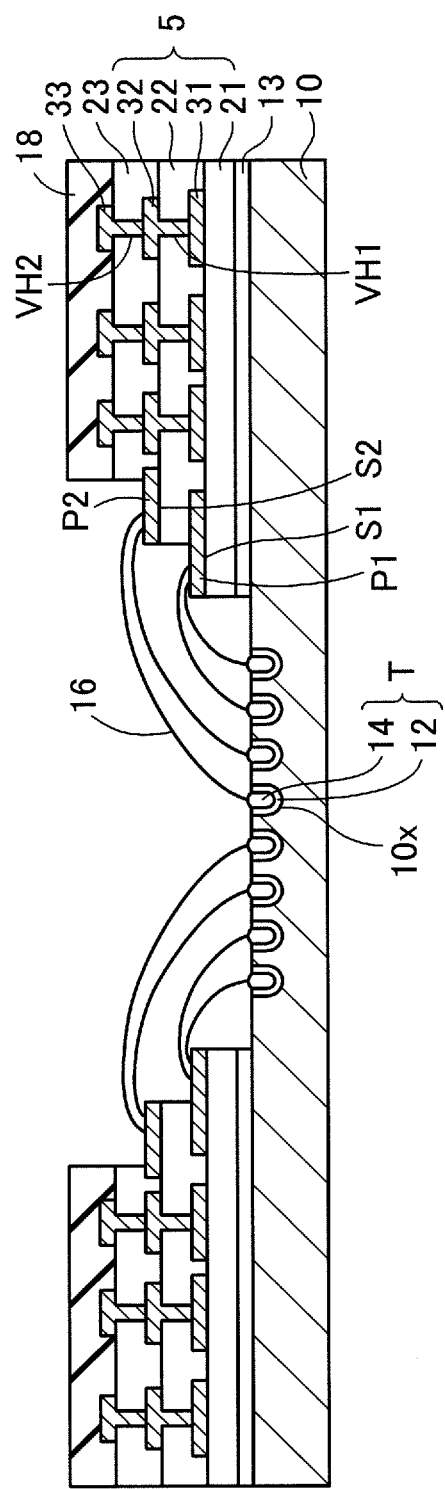
FIG. 16 is a cross-sectional view depicting a method of manufacturing a probe card of a third embodiment (Part 1).

In the method of manufacturing a probe card of the third embodiment, as depicted in FIG. 16, first, the same structure body as that in FIG. 4A in the first embodiment is prepared, and a protective tape 18 is attached onto the insulating layer 23 and wiring layer 33 of the wiring substrate 5.

Figure 17:
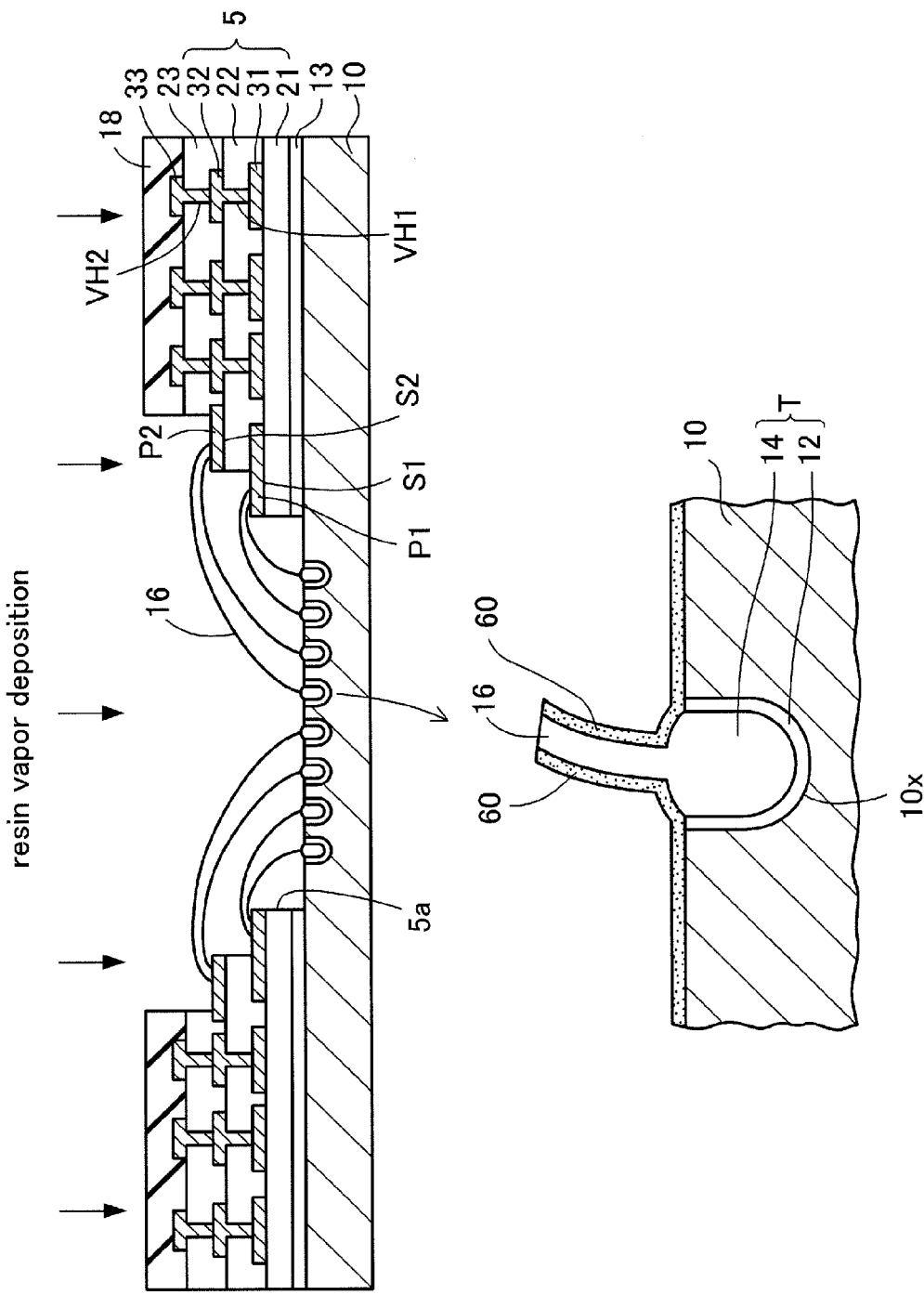
FIG. 17 is a cross-sectional view depicting the method of manufacturing a probe card of the third embodiment (Part 2).

Then, as depicted in FIG. 17, a resin layer 60 is formed on the outer face of each gold wire 16 by vapor deposition. As the resin layer 60, para-xylene resin is preferably used. As depicted in the partially enlarged view in FIG. 17, since the resin formed by the vapor deposition is adhered with the isotropic property, the resin layer 60 is formed to cover the whole outer face of the gold wire 16.

Moreover, though not particularly depicted, the resin layer 60 adheres not only to the gold wires 16 but also to the copper foil 10, the whole inner wall of the opening portion 5a of the wiring substrate 5 including the stepped faces S1 and S2 and the connection pads P1 and P2, and on the protective tape 18.

Figure 18A:
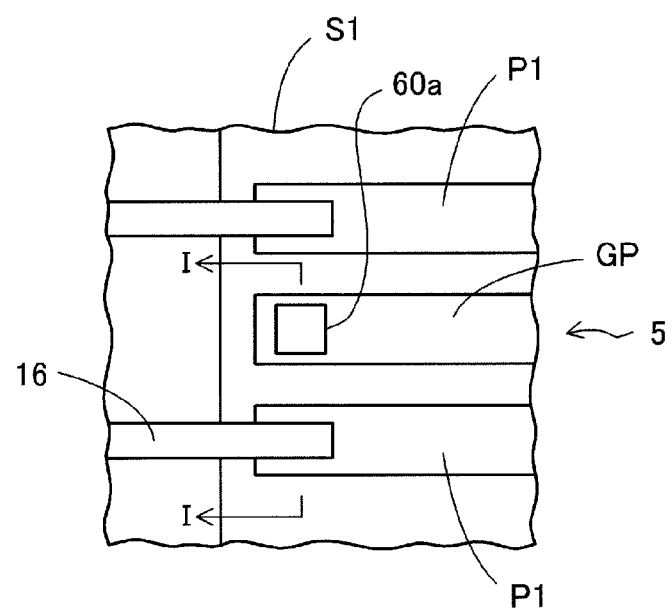
FIGS. 18A and 18B are cross-sectional views depicting the method of manufacturing a probe card of the third embodiment (Part 3).
Figure 18B:
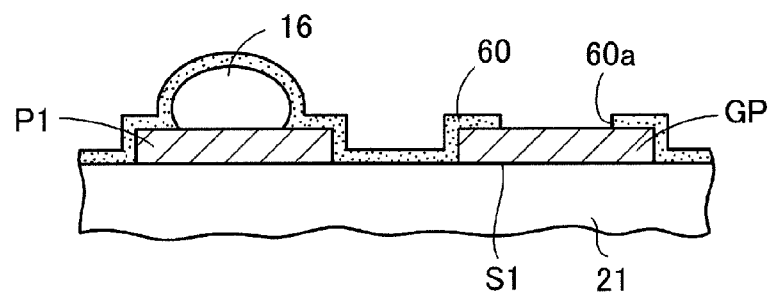

Thereafter, as depicted in FIGS. 18A and 18B, the resin layer 60 formed on each ground pad GP of the wiring substrate 5 is removed to form an opening portion 60a that the ground pad GP is exposed. FIGS. 18A and 18B depict the state of the stepped face S1 of the wiring substrate. FIG. 18B is an enlarged cross-sectional view taken along line I-I in FIG. 18A.

The ground pads GP of the wiring substrate 5 are arranged on both the stepped faces S1 and S2 (FIG. 17), and the opening portion 60a is formed in the resin layer 60 on both of the grand pads GP respectively.

Figure 19A:
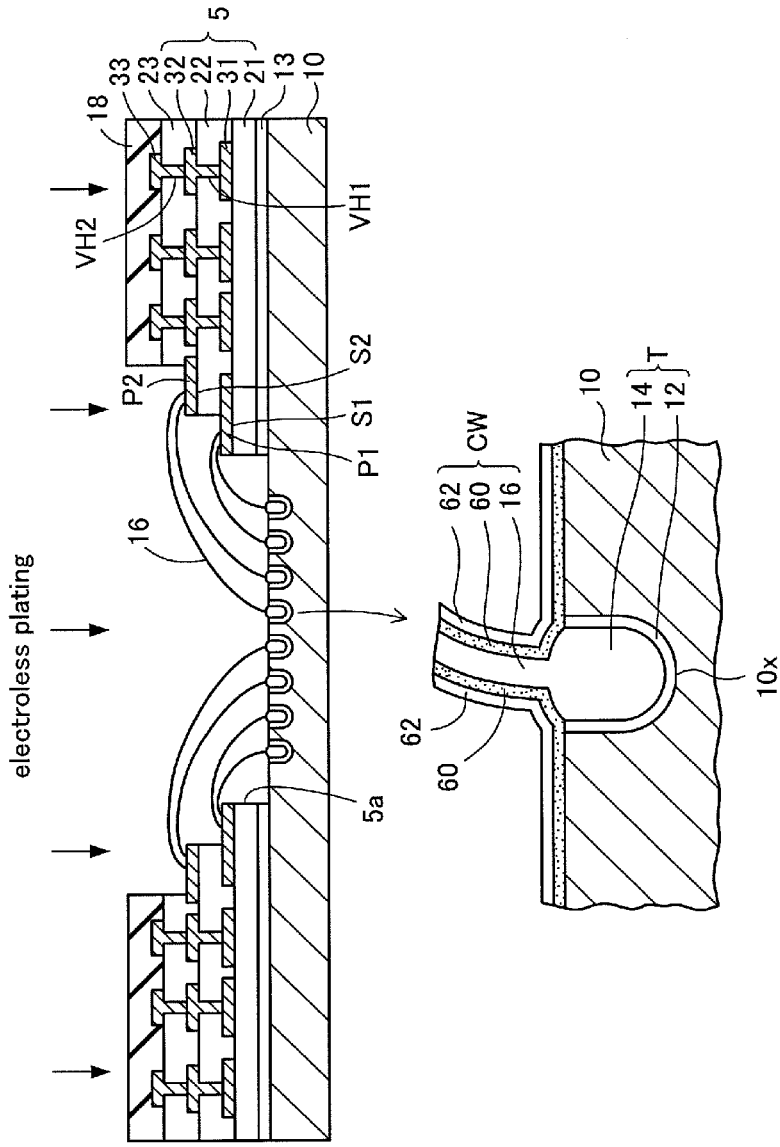
FIGS. 19A and 19B are cross-sectional views depicting the method of manufacturing a probe card of the third embodiment (Part 4).

Then, as depicted in FIG. 19A, a copper layer 62 is formed on the outer face of the resin layer 60 covering the outer face of each gold wire 16 by electroless plating.

Though not particularly depicted, the copper layer 62 adheres not only to the gold wires 16 but also to the resin layer 60 on the copper foil 10, and to the resin layer 60 which covers the inner wall of the opening portion 5a including the stepped faces S1 and S2 and the connection pads P1 and P2, and the protective tape 18. The copper layer 62 may be formed by vapor deposition instead of electroless plating. Moreover, a gold layer may be formed instead of the copper layer 62.

In this way, a coaxial-type wire CW is formed from the gold wire 16, the resin layer 60 covering the gold wire 16, and the copper layer 62 covering the resin layer 60.

Note that the coaxial-type wire CW formed of the gold wire 16, the resin layer 60, and the copper layer 62 is illustrated. A copper wire or the like may be used instead of the gold wire 16, and a different metal layer such as a gold layer may be used instead of the copper layer 62.

Figure 19B:
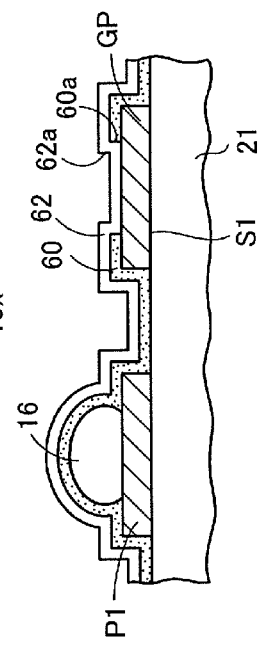

At this time, as depicted in FIG. 19B, the copper layer 62 covering the gold wire 16 is simultaneously formed on the sectional structure in FIG. 18B mentioned above. That copper layer 62 is electrically connected to the ground pad GP through the opening portion 60a of the resin layer 60.

In this way, the outermost copper layer 62 of each coaxial-type wire CW is connected to the ground pad GP of the wiring substrate 5 and set at a ground potential.

Figure 20:
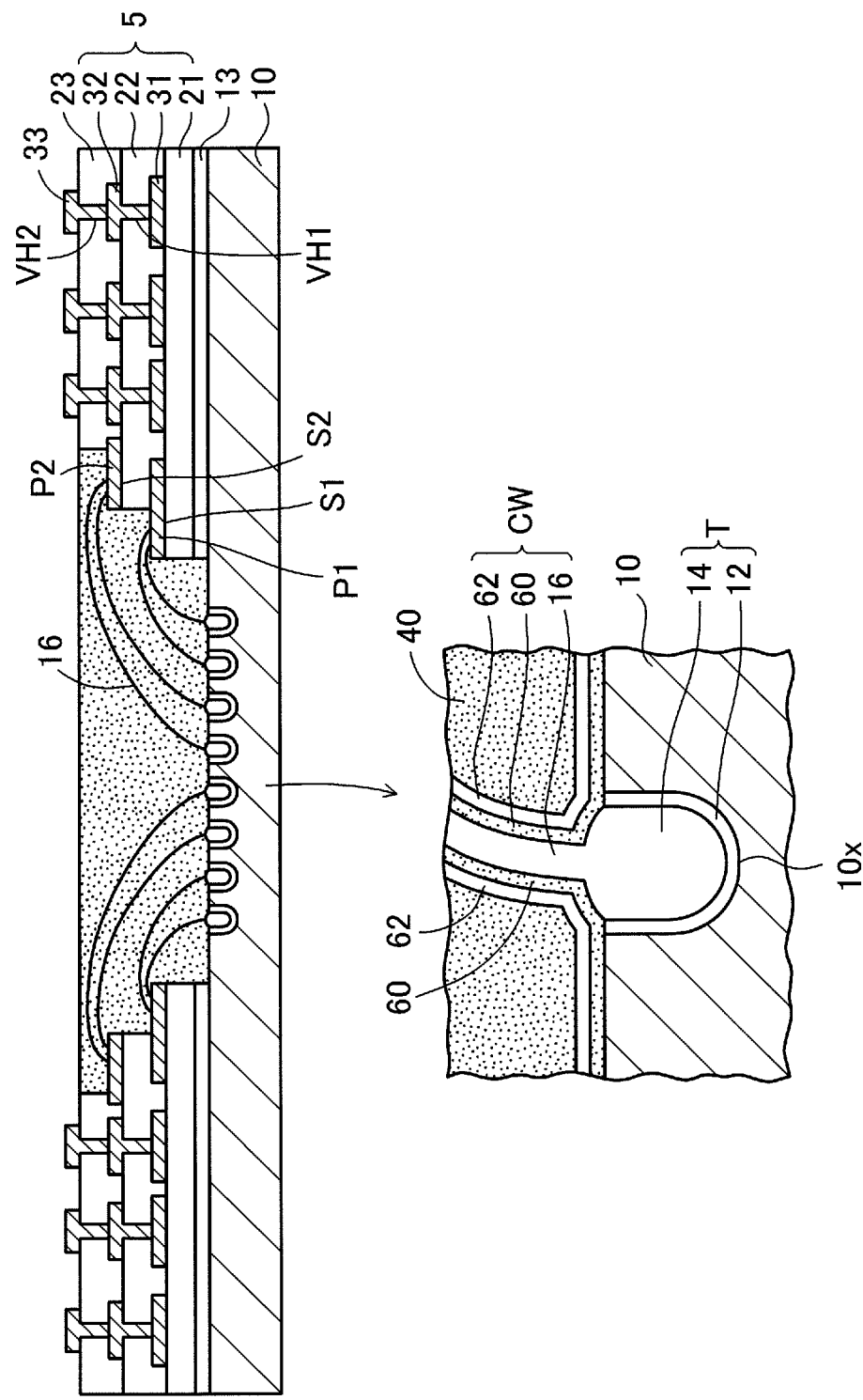
FIG. 20 is a cross-sectional view depicting the method of manufacturing a probe card of the third embodiment (Part 5).
Figure 21:
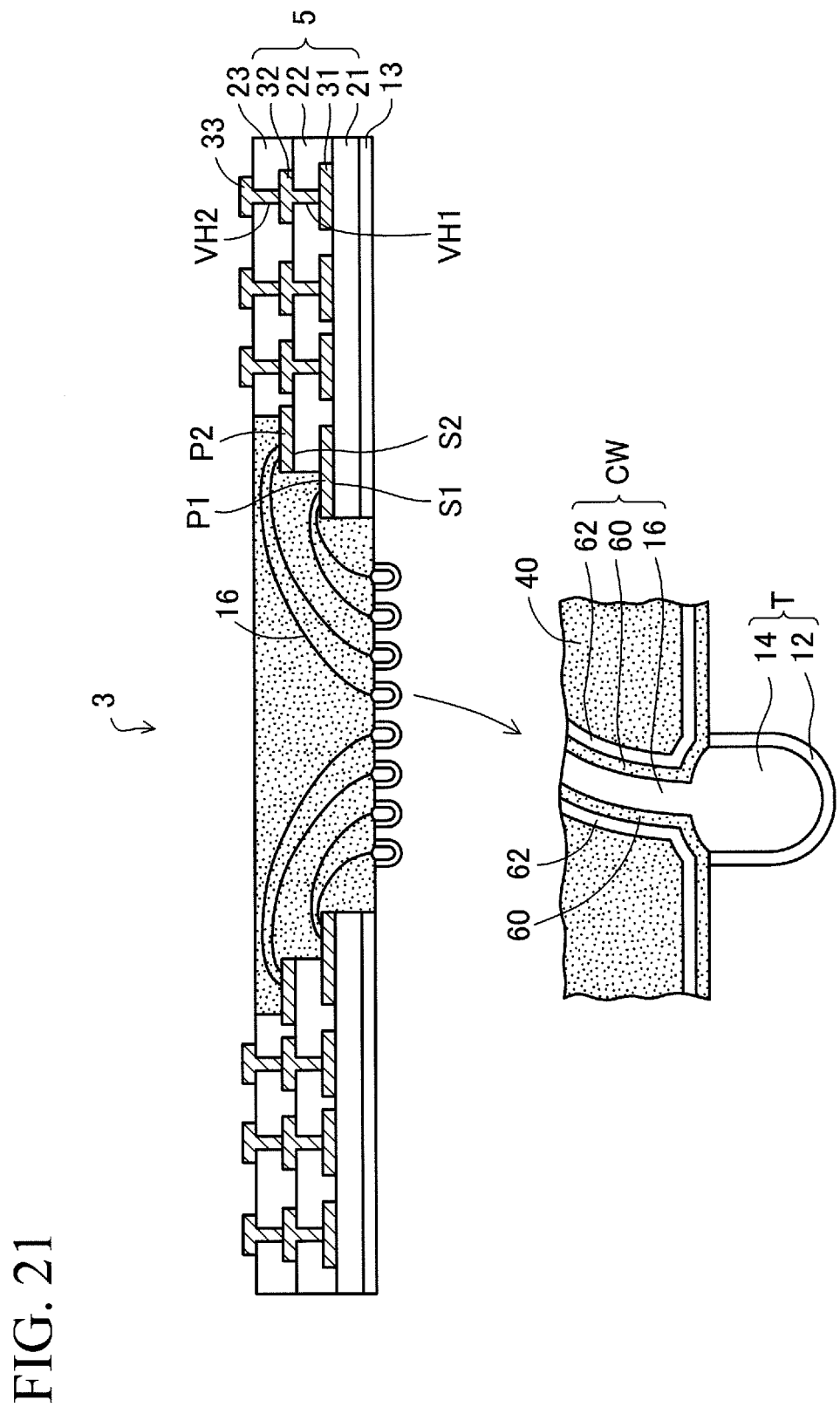
FIG. 21 is a cross-sectional view depicting a probe card of the third embodiment.

Then, as depicted in FIG. 20, the protective tape 18 is removed from the wiring substrate 5. Further, similarly to the step in FIG. 4B in the first embodiment, the resin portion 40 is formed in the opening portion 5a of the wiring substrate 5 to bury the coaxial-type wires CW inside the resin portion 40.

Thereafter, as depicted in FIG. 21, similarly to the step in FIG. 5 in the first embodiment, the copper foil 10 is removed from the structure body in FIG. 20 to expose the contact terminals T.

By the above steps, a probe card 3 of the third embodiment is obtained.

As depicted in the partially enlarged view in FIG. 21, in the probe card 3 of the third embodiment, the wire connected to the contact terminal T is the coaxial-type wire CW. The coaxial-type wire CW is formed of a gold wire 16, a resin layer 60 covering the gold wire 16, and a copper layer 62 covering the resin layer 60. Then, the copper layers 62 of all the coaxial-type wires CW are electrically connected to the ground pads GP of the wiring substrate 5.

The probe card of this embodiment enables measurement of electric characteristics of a test object including the electrode pads of the area-array type, and the arrangement pitch of the wires connected to the contact terminals is set to a narrow pitch which is 100 μm or less, further about 40 μm to 35 μm. Then, the electric measurement of the test object is performed by using a similar method to FIG. 7 in the first embodiment.

When the electric measurement of the test object is performed in a state that the wires are arranged at a narrow pitch as mentioned above, capacitive coupling between closely located wires becomes a problem. That is, a capacitor is formed between the closely located wires, and the capacitor affects the bad influence to the electric measurement.

In the probe card 3 of the third embodiment, the wire connected to the contact terminal T is a coaxial-type wire CW, therefore capacitive coupling between the plurality of wires never occurs. Accordingly, the problem of noises generated when the wires are arranged with the narrower pitch can be solved.

Moreover, further noise reduction can be achieved since the outermost copper layer 62 of the coaxial-type wire CW is connected to the ground pad GP of the wiring substrate 5 to be at the ground potential.

Fourth Embodiment

FIGS. 22A to 24B are views depicting a method of manufacturing a probe card of a fourth embodiment. FIG. 25 is a view depicting a probe card of the fourth embodiment. In the fourth embodiment, it will be explained that a method for forming the gold electrode which becomes the contact terminal on the concave portion of a copper foil with good adhesion by wire bonding method, without forming the gold plating layer for adhesion inside the concave portion.

Figure 22A:
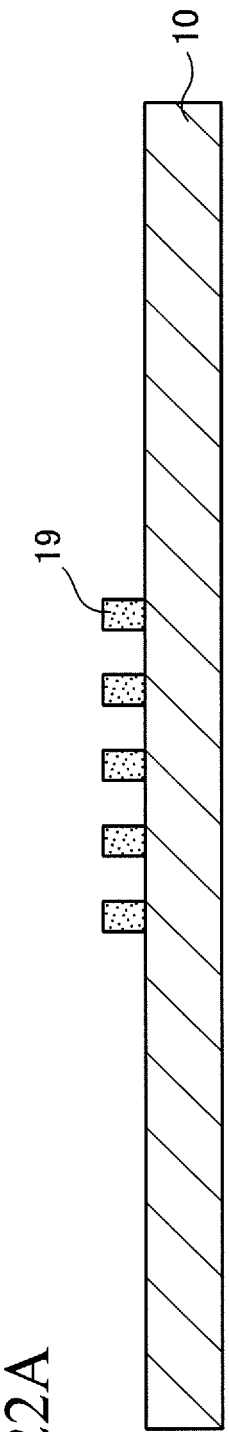
FIGS. 22A to 22C are cross-sectional views depicting a method of manufacturing a probe card of a fourth embodiment (Part 1).

In the method of manufacturing a probe card of the fourth embodiment, as depicted in FIG. 22A, first, similarly to FIG. 1A in the first embodiment, the copper foil 10 is prepared as the first metal layer. Further, a plating resist 19 is patterned on the copper foil 10. The plating resist 19 is left with the island patterns at positions corresponding to the concave portions 10x of the copper foil 10 explained in FIG. 1C in the first embodiment.

Figure 22B:
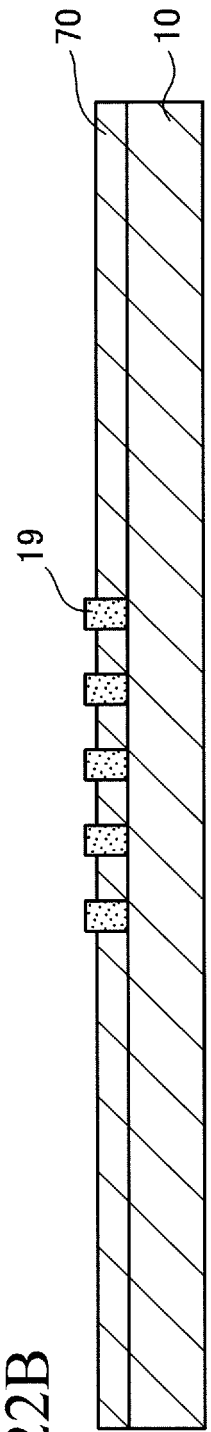
Figure 22C:
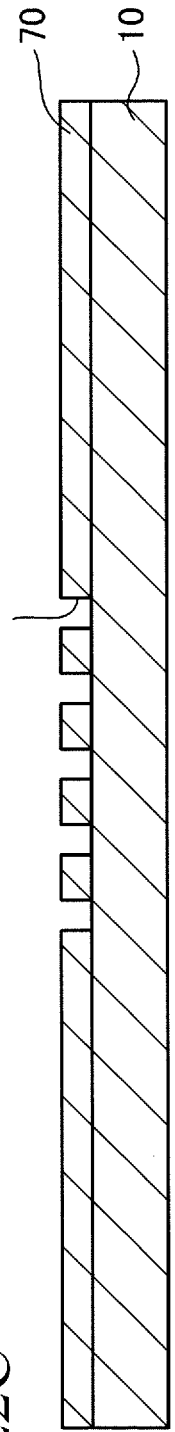

Then, as depicted in FIG. 22B, a copper layer as a second metal layer is formed on the exposed face of the copper foil 10 by electroplating utilizing the copper foil 10 as a plating power feeding path. The thickness of the copper layer 70 is set to 20 µm to 50 µm, for example. Thereafter, as depicted in FIG. 22C, the plating resist 19 is removed by a resist stripper.

By this matter, a plurality of concave portions 70x are formed in the copper layer 70 in which the height is added on the copper foil 10. The diameter of each concave portion 70x is about 10 µm to 30 µm, for example.

The plurality of concave portions 70x of the copper layer 70 are formed to correspond to the plating resist 19 with the island patterns arranged on the flat copper foil 10. Therefore, the concave portions 70x are formed in a state that a bottom face thereof is made to a flat face.

As described above, in the fourth embodiment, by forming the copper layer 70 (second metal layer) including the concave portions 70x such that the height is added on the copper foil 10 (first metal layer), a metal base material in which the plurality of concave portions are formed is obtained.

Note that a nickel foil may be used as the first metal layer instead of the copper foil 10. In this case, a nickel layer may be formed as the second metal layer instead of the copper layer 70 by a similar method, and the concave portions may be formed in the nickel layer.

Figure 23A:
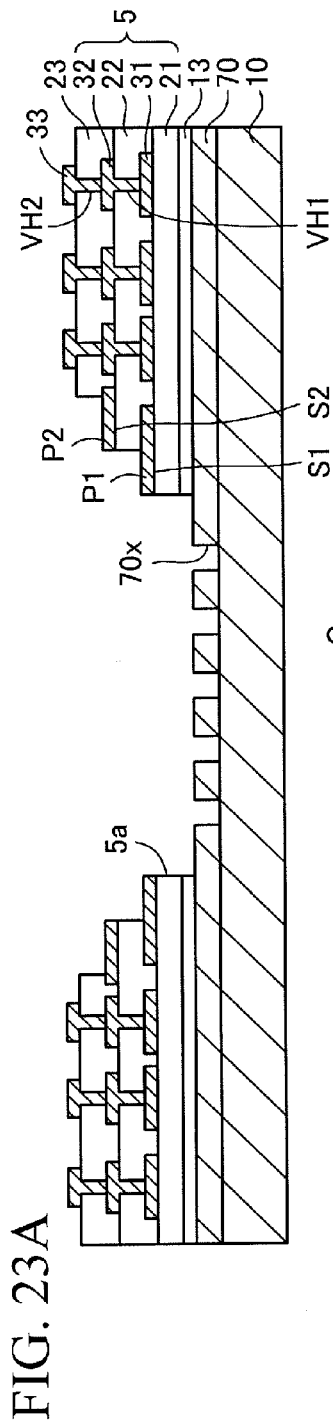

Then, as depicted in FIG. 23A, by using a similar method to the step in FIGS. 3A and 3B in the first embodiment, the wiring substrate 5 in which the opening portion 5a is provided in the center is adhered onto the copper layer 70 by an adhesive layer 13.

Figure 23B:
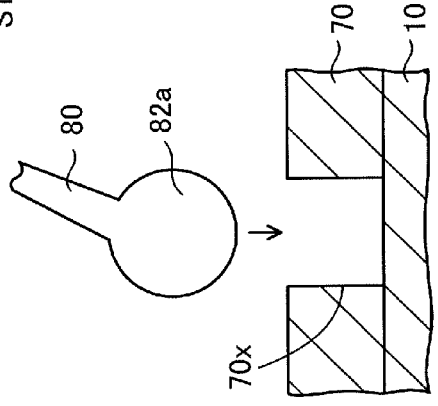
Figure 23C:
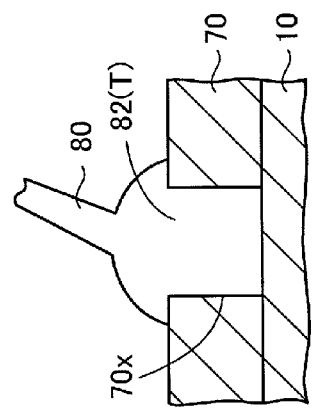

FIGS. 23B and 23C are partially enlarged cross-sectional views depicting a state that a gold electrode is buried into the concave portions 70x of the copper layer 70 in FIG. 23A on the basis of the wire bonding. As depicted in FIG. 23B, similarly to the step in FIG. 4A in the first embodiment, on the basis of the wire bonding, a tip part of a gold wire 80 protruded from the capillary (not depicted) of a wire bonder is rounded into a ball shape by the electric discharge to obtain a ball-shaped portion 82a.

Further, as depicted in FIG. 23C, the capillary is lowered to arrange the ball-shaped portion 82a of the gold wire 80 into the concave portions 70x of the copper layer 70, and the ball-shaped portion 82a is pressured along with heating and ultrasonic vibration to be squeezed into and buried inside the concave portion 70x.

By this matter, similarly to the first embodiment, the concave portion 70x of the copper layer 70 is filled with a gold electrode 82 from the wire bonder, and a contact terminal T is obtained from the gold electrode 82.

Figure 24A:
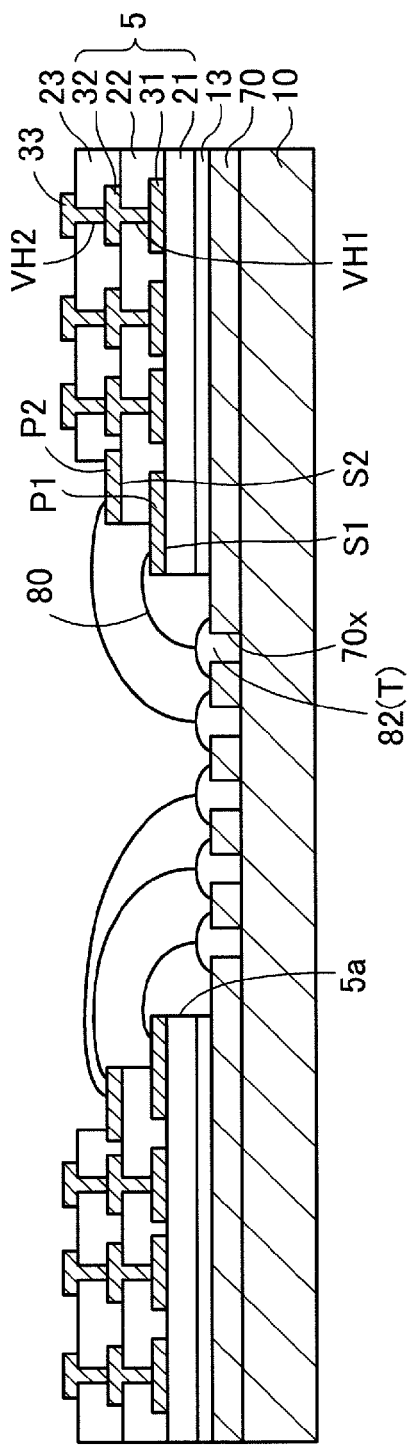
FIGS. 24A and 24B are cross-sectional views depicting the method of manufacturing a probe card of the fourth embodiment (Part 3).
Figure 25:
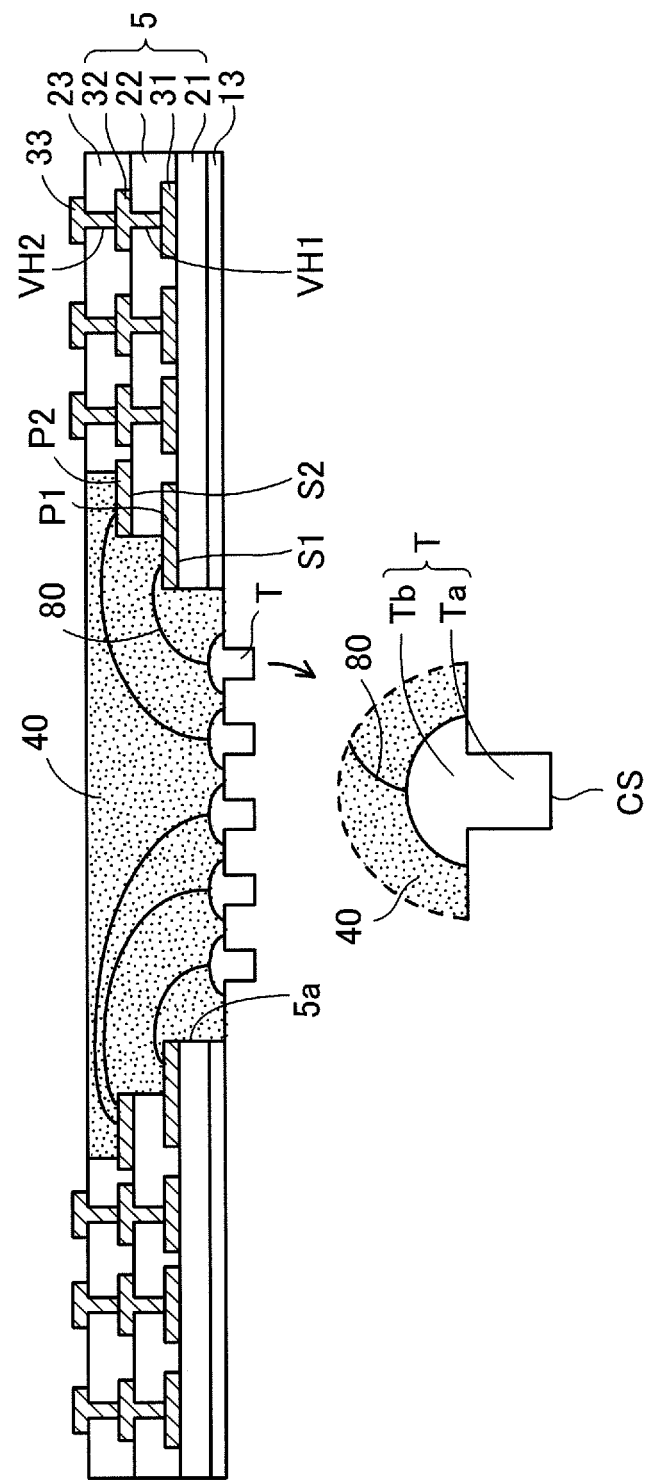
FIG. 25 is a cross-sectional view depicting a probe card of the fourth embodiment.

Thereafter, as depicted in FIG. 24A, the capillary (not depicted) is raised to move the gold wire 80 to the connection pads P1 of the wiring substrate 5, and the gold wire 80 is bonded to the connection pad P1.

In this way, similarly to the first embodiment, the inside of the concave portion 70x of the copper layer 70 is connected to the connection pads P1 and P2 of the wiring substrate 5 by a gold wire 80 respectively.

In the step in FIGS. 23B and 23C mentioned above, the diameter of the ball-shaped portion 82a of the gold wire 80 is set equal to or greater than the diameter of the concave portion 70x. For example, in the case that the diameter of the concave portion 70x is 10 µm to 30 µm, the diameter of the ball-shaped portion 82a of the gold wire 80 is set to about 20 µm to 40 µm.

By doing like this, as depicted in FIG. 23C, the gold electrode 82 arranged in the concave portion 70x is formed such that the gold electrode 82 is buried in the whole concave portion 70x and is extended to the upper face of the copper layer 70 from the upper side of the concave portion 70x.

For this reason, the gold electrode 82 is sufficiently adhered to the inner wall of the concave portion 70x of the copper layer 70 and the upper face of the copper layer 70. By this matter, when the gold wire 80 is moved to the connection pad P1 of the wiring substrate 5, there is no fear that the gold electrode 82 drops out from the concave portion 70x.

As described above, the gold electrode 82 can be arranged inside the concave portion 70x of the copper layer 70 with good adhesion, without forming any gold plating layer for adhesion inside the concave portion 70x of the copper layer 70.

Figure 24B:
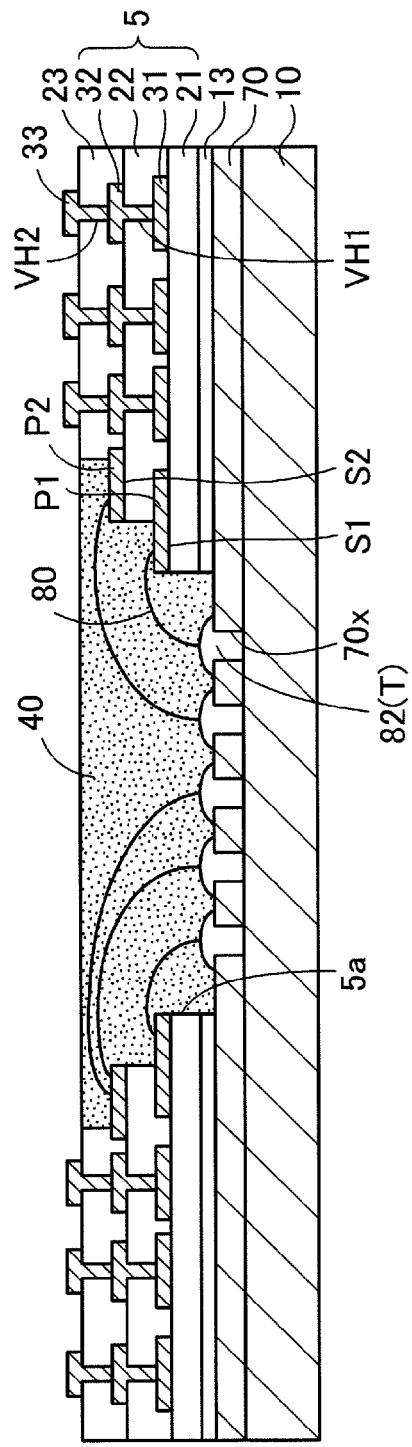

Thereafter, as depicted in FIG. 24B, similarly to the step in FIG. 4B in the first embodiment, the resin portion 40 is formed in the opening portion 5a of the wiring substrate 5 to bury the gold wire 80 inside the resin portion 40.

Then, as depicted in FIG. 25, similarly to the step in FIG. 5 in the first embodiment, the copper foil 10 and the copper layer 70 are removed to expose the contact terminal T.

By the above steps, a probe card 4 of the fourth embodiment is obtained. As mentioned above, the contact terminal T of the probe card 4 of the fourth embodiment is formed by burying the ball-shaped portion 82a of a gold wire into the concave portion 70x of the copper layer 70 in which the bottom face thereof is made to the flat face.

Therefore, the contact terminal T is formed to include a columnar contact portion Ta protruding from the lower face of the resin portion 40, and a convex portion Tb having a curved face, which is arranged on the columnar contact portion Ta and is buried in the resin portion 40. Then, a contact face CS of the tip of the contact terminal T is formed as a flat face. The convex portion Tb having the curved face is preferably the convex portion in a semispherical shape.

Moreover, as mentioned above, in the fourth embodiment, no gold plating layer for adhesion is formed on the concave portions 70x of the copper layer 70, and therefore the contact terminal T of the probe card 4 is formed of only the gold electrode obtained by wire bonding.

Further, in the fourth embodiment, the contact face CS of the tip of each contact terminal T is a flat face, and therefore a large contact area can be secured for measuring electric characteristics as compared to spherical contact terminals. Accordingly, the electric characteristics can be measured more stably.

Furthermore, the contact terminal T includes the semispherical convex portion Tb wider than the columnar contact portion Ta, and therefore the semispherical convex portion Tb has a larger contact area with the resin portion 40.

Thus, stress exerted when the contact terminal T is brought into contact with a measuring wiring substrate 50 is not concentrated at the contact point with the wire 80, instead, the stress can be distributed to the resin portion 40 from the semispherical convex portion Tb. Accordingly, it is possible to prevent breakage of the contact parts of the wire 80 and the contact terminal T.

The probe card 4 of the fourth embodiment can bring about advantageous effects similar to those of the first embodiment.

Similarly to FIG. 7 in the first embodiment, Also, the probe card 4 of the fourth embodiment is arranged on the wiring substrate 50, and the electric characteristics of the wiring substrate 50 are measured in a state that the probe card 4 is pressed downward by the pressing mechanism 54.

Moreover, the probe card 4 of the fourth embodiment may be used in four-terminal testing as explained in FIG. 8 and FIGS. 9A to 9E.

Fifth Embodiment

FIGS. 26A to 29 are views depicting a method of manufacturing a probe card of a fifth embodiment. FIG. 30 is a view depicting a probe card of the fifth embodiment. In the fifth embodiment, following the fourth embodiment, it will be explained that another method for forming the gold electrode which becomes the contact terminal on the concave portion of a copper foil with good adhesion by wire bonding method, without forming the gold plating layer for adhesion inside the concave portion.

Figure 26A:
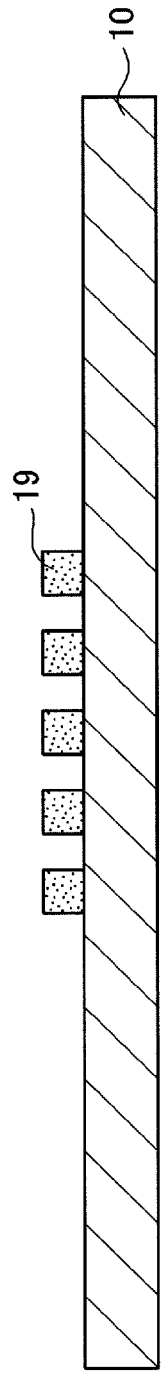
FIGS. 26A and 26B are cross-sectional views depicting a method of manufacturing a probe card of a fifth embodiment (Part 1).

In the method of manufacturing a probe card of the fifth embodiment, as depicted in FIG. 26A, first, similarly to FIG. 22A in the fourth embodiment, the plating resist 19 is patterned on the copper foil 10.

Figure 26B:
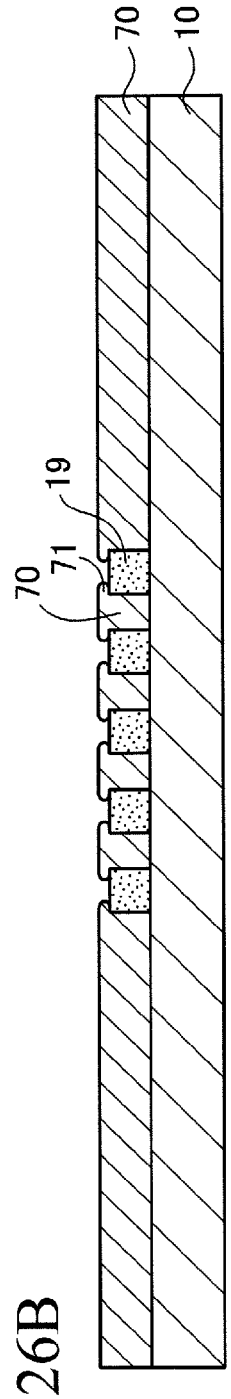
Figure 26B:
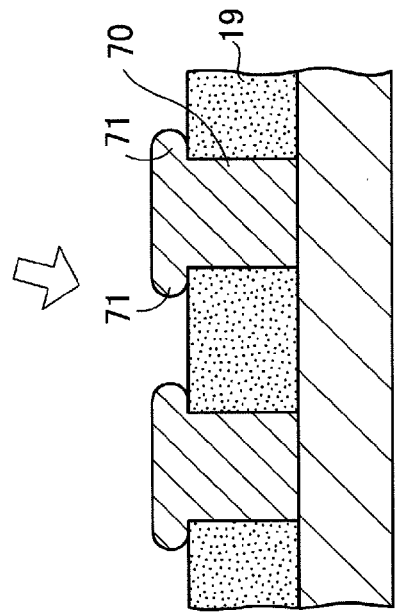

Then, as depicted in FIG. 26B, similarly to FIG. 22B in the fourth embodiment, the copper layer 70 is formed on the exposed face of the copper foil 10 by electroplating. In the fifth embodiment, the thickness of the copper layer 70 is set thicker than the thickness of the plating resist 19.

At this time, as depicted in the partially enlarged view in FIG. 26B, the parts of the copper layer 70 located to an upper side from an upper face of the plating resist 19 are formed with the isotropic property by plating. Hence, the upper end part of the copper layer 70 is formed as a protruding portion 71 (stepped portion) protruding in a lateral direction from a pattern edge of the plating resist 19.

Figure 27:
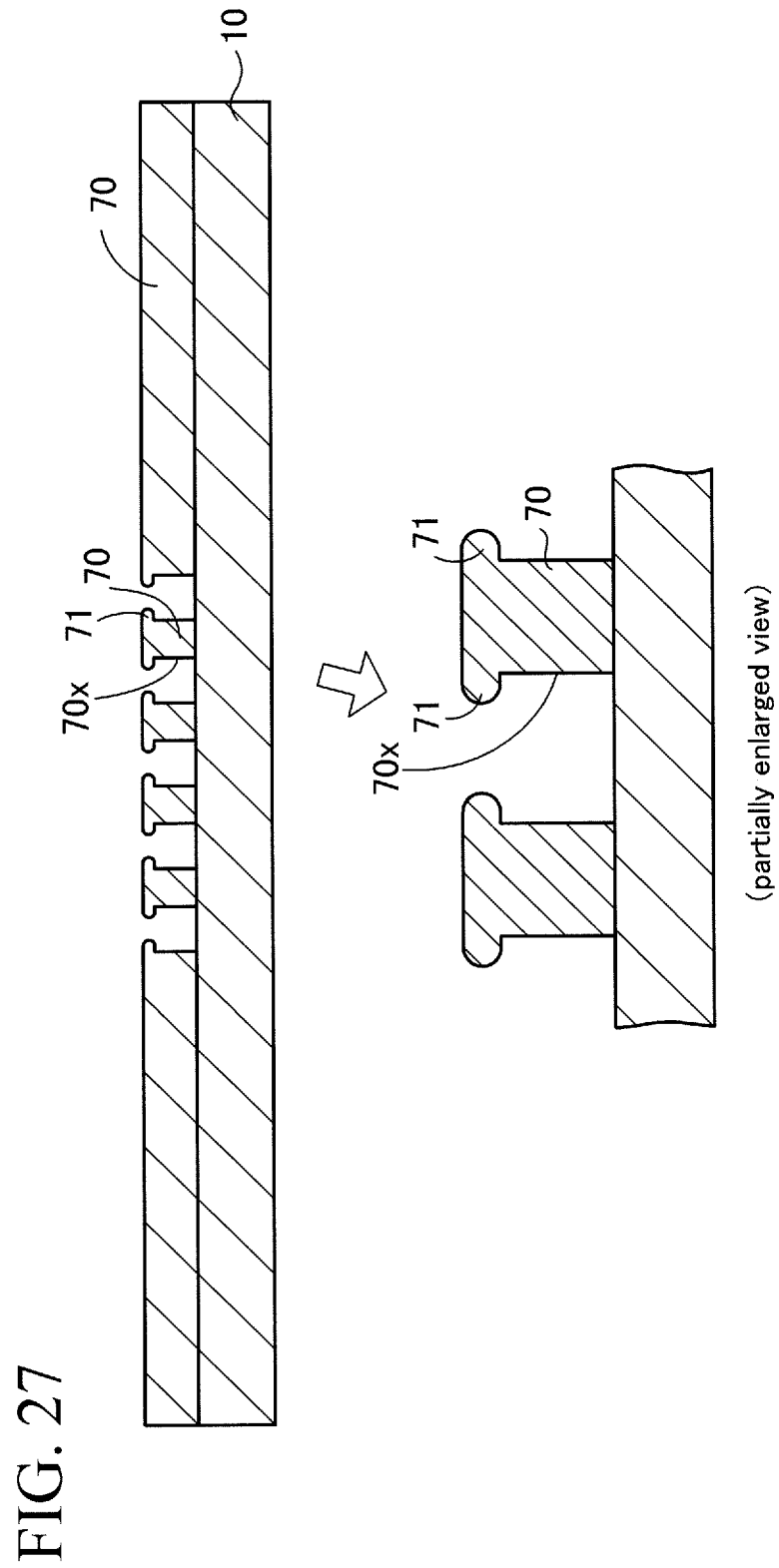
FIG. 27 is a cross-sectional view depicting the method of manufacturing a probe card of the fifth embodiment (Part 2).

Thereafter, as depicted in FIG. 27, the plating resist 19 is removed by the resist stripper. By this matter, similarly to FIG. 22C in the fourth embodiment, a plurality of concave portions 70x are formed in the copper layer 70. As depicted in the partially enlarged view in FIG. 27, each concave portion 70x of the copper layer 70 is formed to have the protruding portion 71 protruding inwardly on the inner wall of the upper end thereof.

Thus, the concave portions 70x are obtained which have an overhanging shape that the width of the upper opening portion thereof is set smaller than the width of any lower portion thereof.

Figure 28A:
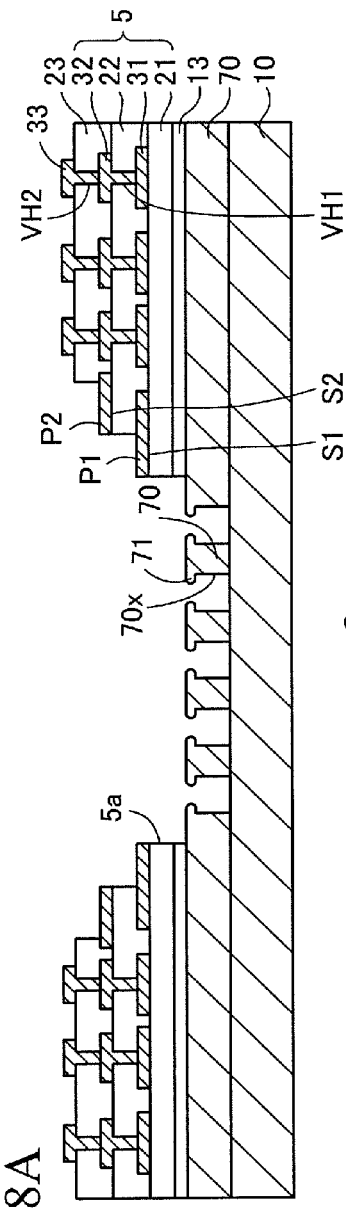
FIGS. 28A to 28C are cross-sectional views depicting the method of manufacturing a probe card of the fifth embodiment (Part 3).

Then, as depicted in FIG. 28A, by using a similar method to the step in FIGS. 3A and 3B in the first embodiment, the wiring substrate 5 in which the opening portion 5a is provided in the center is adhered onto the copper layer 70 by the adhesive layer 13.

Figure 28B:
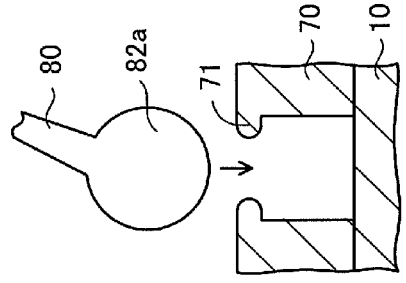
Figure 28C:
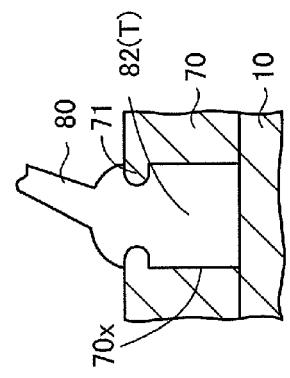

FIGS. 28B and 28C are partially enlarged cross-sectional views depicting a state that a gold electrode is buried into the concave portions 70x of the copper layer 70 in FIG. 28A by wire bonding. As depicted in FIG. 28B, similarly to the step in FIG. 23B in the fourth embodiment, the tip part of the gold wire 80 is rounded by the electric discharge to obtain a ball-shaped portion 82a.

Further, as depicted in FIG. 28C, by using a similar method to the step in FIG. 23C in the fourth embodiment, the ball-shaped portion 82a of the gold wire 80 is squeezed into the concave portions 70x, so that the gold electrode 82 is buried as a metal electrode inside the concave portion 70x to obtain a contact terminal T.

Figure 29:
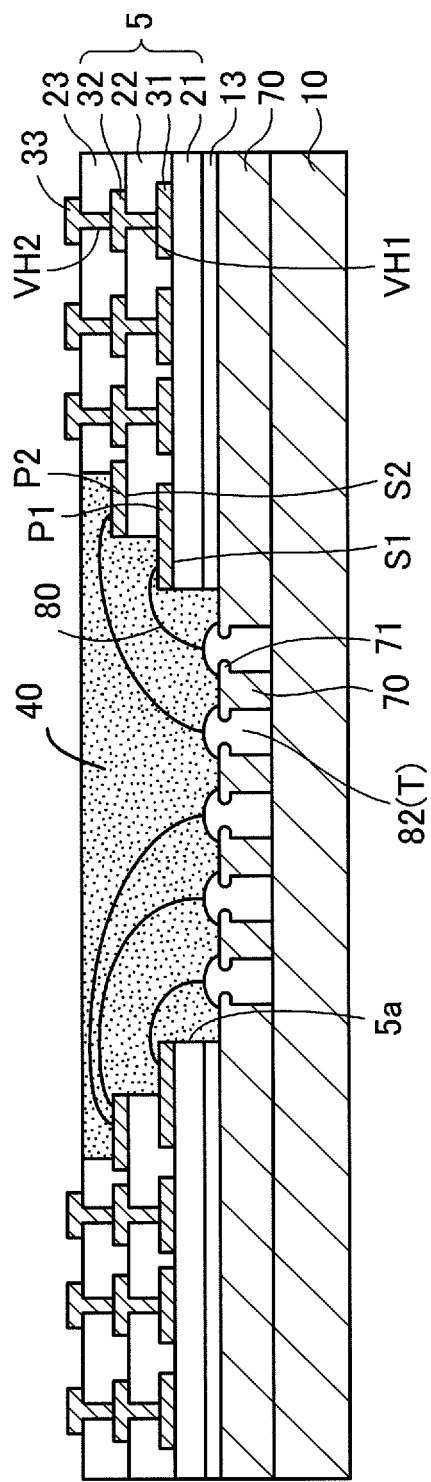
FIG. 29 is a cross-sectional view depicting the method of manufacturing a probe card of the fifth embodiment (Part 4).
Figure 30:
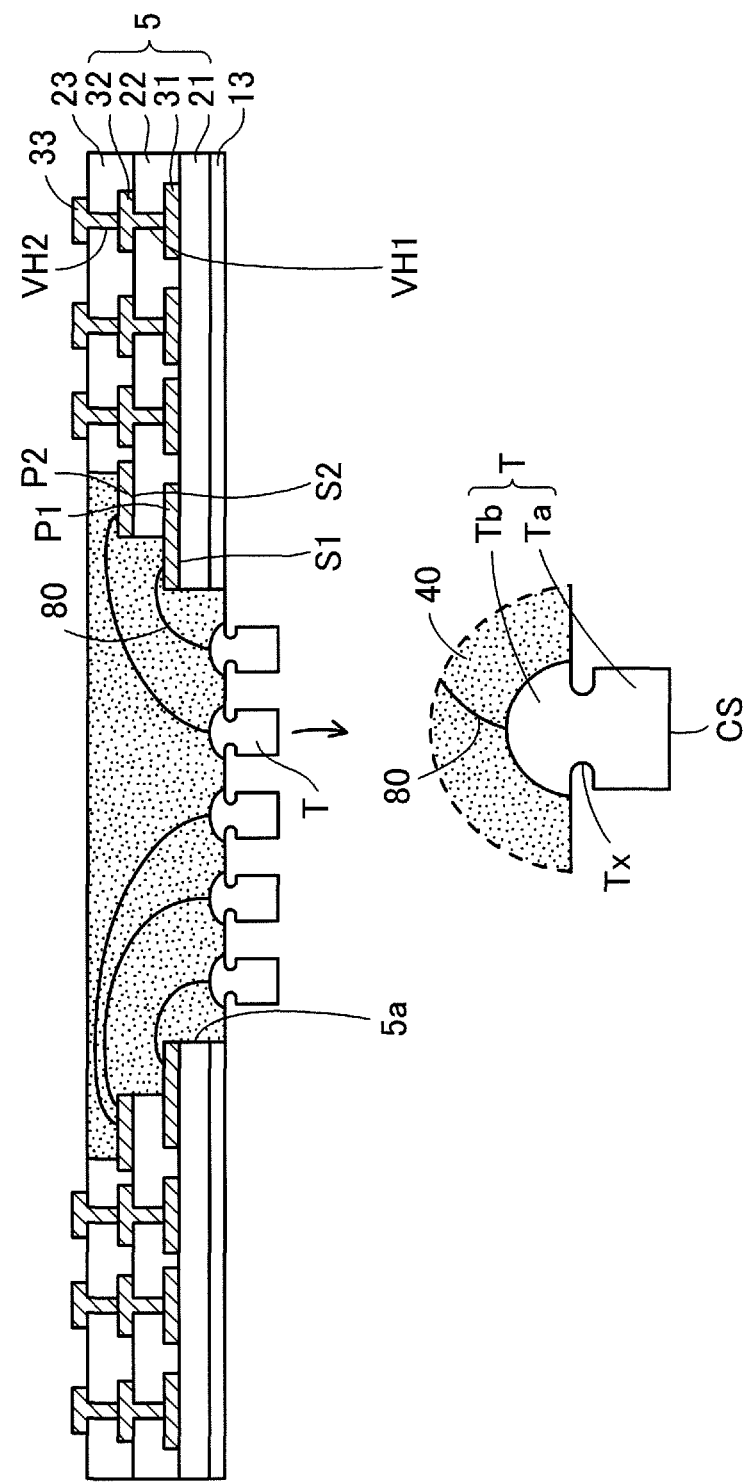
FIG. 30 is a cross-sectional view depicting a probe card of the fifth embodiment.

Thereafter, as depicted in FIG. 29, similarly to FIG. 24A in the fourth embodiment, the gold wire 80 is moved to the connection pads P1 of the wiring substrate 5, and the gold wire 80 is bonded to the connection pad P1.

In this way, similarly to the first embodiment, the inside of the concave portion 70x of the copper layer 70 is connected to the connection pads P1 and P2 of the wiring substrate 5 by the gold wire 80 respectively.

In the fifth embodiment, as depicted in FIG. 28C, each concave portion 70x of the copper layer 70 includes the protruding portion 71 protruding inwardly on the upper part of the inner wall thereof. The protruding portion 71 of the concave portion 70x functions as a stopper that prevents that the gold electrode 82 drops out.

Therefore, it is no fear that when the gold wire 80 is moved to the connection pad P1 of the wiring substrate 5, the gold electrode 82 drops out from the concave portion 70x. In the fifth embodiment, the gold electrode 82 is arranged in the concave portion 70x so as to wrap around below the protruding portion 71, and therefore it is prevented that the gold electrode 82 drops out more securely than the fourth embodiment.

As described above, similarly to the fourth embodiment, the gold electrode 82 can be formed inside the concave portion 70x of the copper layer 70 with good adhesion without forming any gold plating layer for adhesion inside the concave portion 70x of the copper layer 70.

Further, as depicted in FIG. 29 likewise, similarly to the step in FIG. 4B in the first embodiment, the resin portion 40 is formed in the opening portion 5a of the wiring substrate 5 to bury the gold wire 80 inside the resin portion 40. Then, as depicted in FIG. 30, similarly to the step in FIG. 5 in the first embodiment, the copper foil 10 and the copper layer 70 are removed to expose the contact terminal T.

By the above steps, a probe card 4a of the fifth embodiment is obtained. In the probe card 4a of the fifth embodiment, similarly to the probe card 4 of the fourth embodiment, the contact terminal T is formed to include the columnar contact portion Ta protruding from the lower face of the resin portion 40, and a semispherical convex portion Tb arranged on the columnar contact portion Ta and buried in the resin portion 40. Moreover, a contact face CS of the tip of the contact terminal T is formed as a flat face.

Moreover, the contact terminal T is formed such that an annular part between the contact portion Ta and the convex portion Tb is formed as a constricted portion Tx that is recessed inward.

The probe card 4a of the fifth embodiment brings about advantageous effects similar to those of the first embodiment.

Similarly to FIG. 7 in the first embodiment, also, the probe card 4a of the fifth embodiment is arranged on the wiring substrate 50, and electric characteristics of the wiring substrate 50 are measured in a state that the probe card 4a is pressed downward by the pressing mechanism 54. Moreover, the probe card 4a of the fifth embodiment may be used in four-terminal testing as explained in FIG. 8 and FIGS. 9A to 9E.

Sixth Embodiment

FIGS. 31A to 32B are views depicting a method of manufacturing a probe card of a sixth embodiment. FIG. 33 is a view depicting a probe card of the sixth embodiment. In the sixth embodiment, it will be explained that the manufacturing method of the fourth or fifth embodiment is utilized, and the resin portion protrudes outward beyond a peripheral region and the contact terminals are arranged on the protruding portion of the resin portion.

Figure 31A:
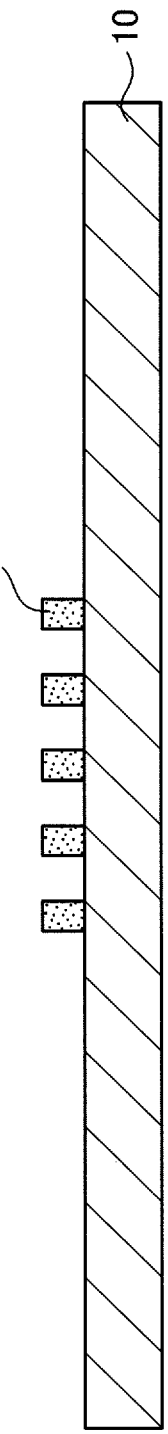
FIGS. 31A and 31B are cross-sectional views depicting a method of manufacturing a probe card of a six embodiment (Part 1).

In the method of manufacturing a probe card of the sixth embodiment, as depicted in FIG. 31A, first, similarly to FIG. 22A in the fourth embodiment, the plating resist 19 is patterned on the copper foil 10.

Figure 31B:
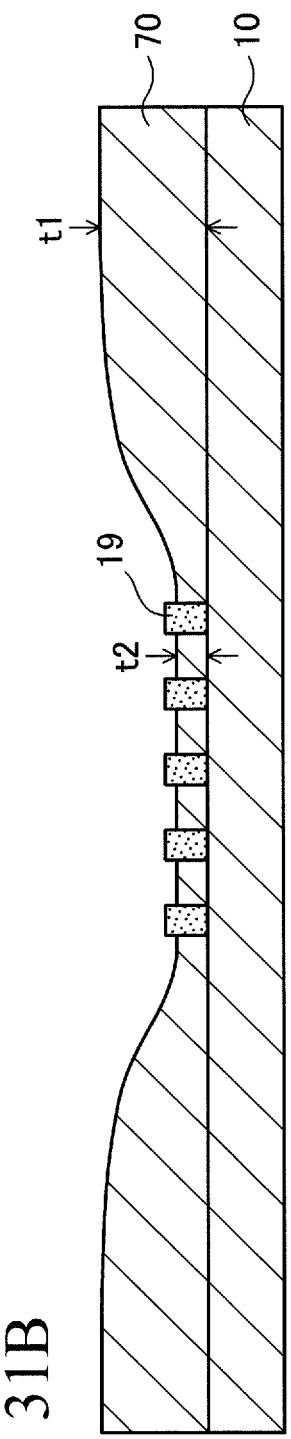

Then, as depicted in FIG. 31B, similarly to FIG. 22B in the fourth embodiment, the copper layer 70 is formed on the exposed face of the copper foil 10 by electroplating. Generally, in electroplating, the current density becomes higher in a peripheral region of a plating substrate, and therefore the thickness of a plating layer tends to be thicker in a peripheral region than in a center part.

By employing electroplating conditions under which this tendency becomes remarkable, a thickness t1 of the copper layer 70 on the peripheral region of the copper foil 10 where the plating resist 19 is not arranged can be set thicker than a thickness t2 of the copper layer 70 on the center part.

Figure 32A:
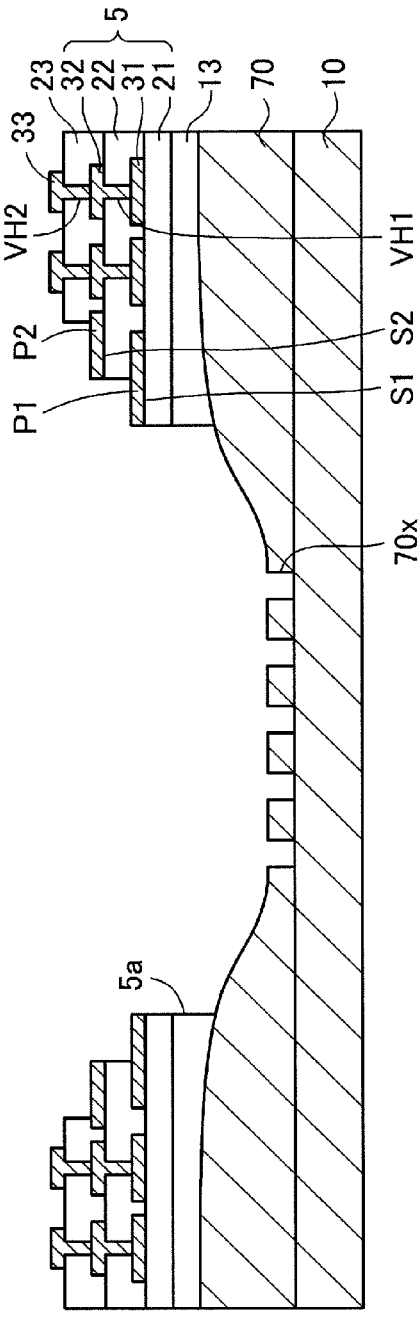
FIGS. 32A and 32B are cross-sectional views depicting the method of manufacturing a probe card of the sixth embodiment (Part 2).
Figure 33:
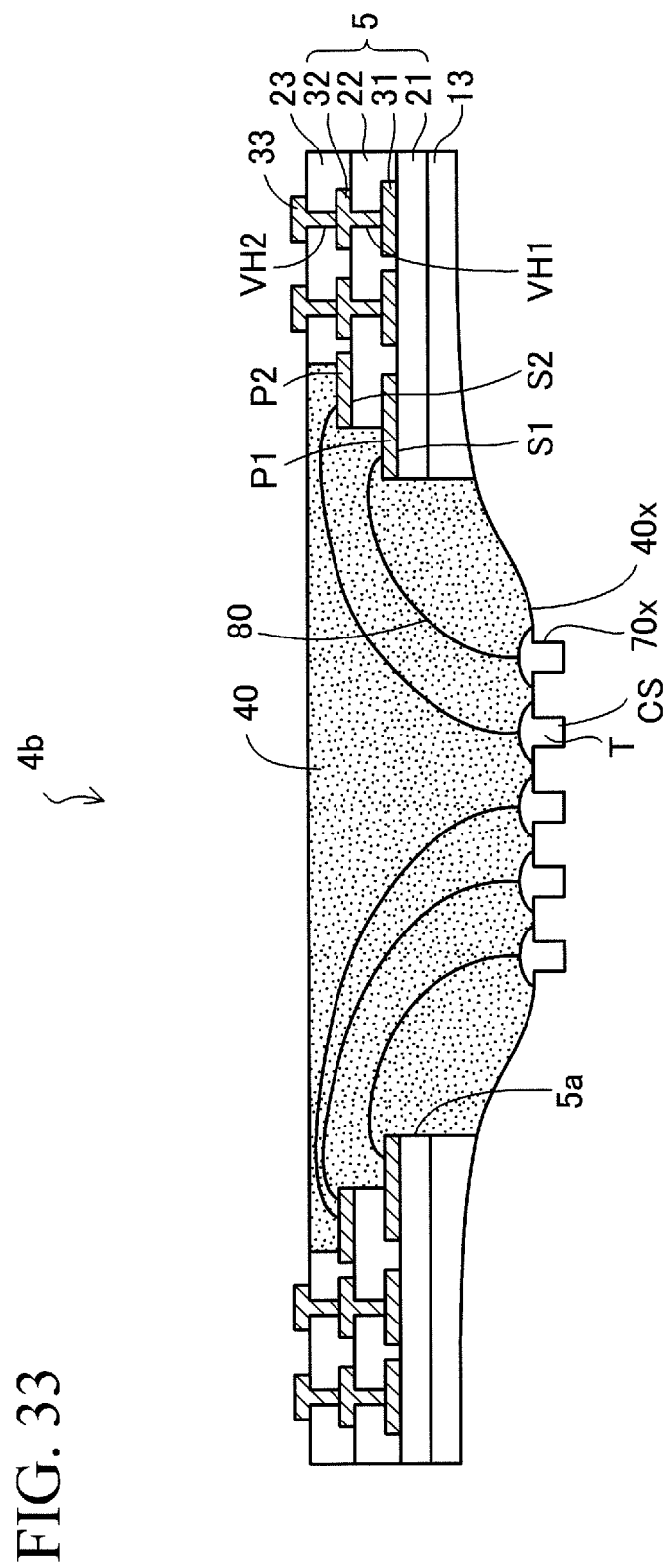
FIG. 33 is a cross-sectional view depicting a probe card of the sixth embodiment.

Thereafter, as depicted in FIG. 32A, the plating resist 19 is removed by the resist stripper, thereby the concave portions 70x are formed in the copper layer 70. Further, by using a similar method to the step in FIGS. 3A and 3B in the first embodiment, the wiring substrate 5 in which the opening portion 5a is provided in the center is adhered onto the copper layer 70 by the adhesive layer 13.

Figure 32B:
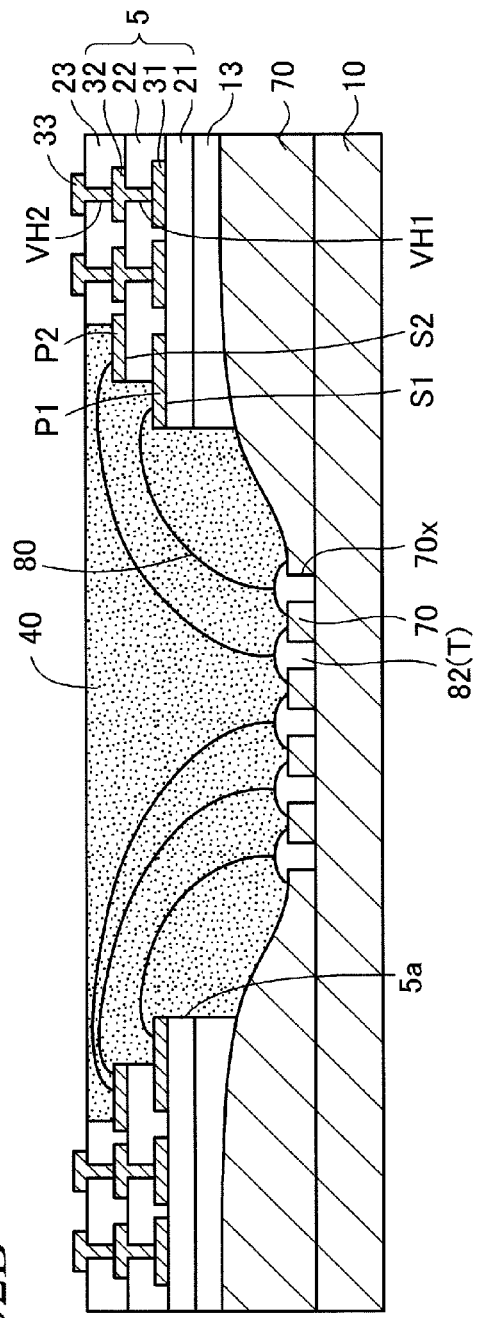

Furthermore, as depicted in FIG. 32B, similarly to FIG. 24A in the fourth embodiment, the inside of the concave portion 70x of the copper layer 70 is connected to the connection pads P1 and P2 of the wiring substrate 5 by a gold wire 80 respectively. Then, as depicted in FIG. 32B likewise, similarly to the step in FIG. 4B in the first embodiment, the resin portion 40 is formed in the opening portion 5a of the wiring substrate 5 to bury the gold wire 80 inside the resin portion 40.

Thereafter, as depicted in FIG. 33, similarly to the step in FIG. 5 in the first embodiment, the copper foil 10 and the copper layer 70 are removed to expose the contact terminal T.

By the above steps, a probe card 4b of the sixth embodiment is obtained. In the probe card 4b of the sixth embodiment, the contact face CS of the tip of the contact terminal T is formed as a flat face like the probe card 4 of the fourth embodiment.

Moreover, like the second embodiment, the resin portion 40 includes the protruding portion 40x protruding downward beyond the peripheral region, and the contact terminals T are arranged on the protruding portion 40x. Thus, the condition of contact of the contact terminals T can be easily checked by the eyes or via image recognition.

Similarly to FIG. 7 in the first embodiment, also, the probe card 4b of the sixth embodiment is arranged on the wiring substrate 50, and electric characteristics of the wiring substrate 50 are measured in a state that the probe card 4b is pressed downward by the pressing mechanism 54. Moreover, the probe card 4b of the sixth embodiment may be used in four-terminal testing as explained in FIG. 8 and FIGS. 9A to 9E.

The probe card 4b of the sixth embodiment brings about advantageous effects similar to those of the first and second embodiments.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a probe card, comprising:

preparing a metal base material in which a plurality of concave portions are formed in a surface region thereof;

preparing a wiring substrate including an opening portion and connection pads arranged on an upper face of the wiring substrate located on a periphery of the opening portion;

adhering the wiring substrate on the metal base material such that the plurality of concave portions of the metal base material are exposed from the opening portion of the wiring substrate;

connecting an inside of each of the concave portions of the metal base material and the connection pads of the wiring substrate by a wire of a wire bonding method respectively;

forming a resin portion formed of a material having elasticity in the opening portion of the wiring substrate, the resin portion burying the wire; and removing the metal base material to expose a contact terminal protruding from the resin portion, wherein the contact terminal is formed of an end part of the wire, and is formed integrally with the wire.

(Clause 2) The method of manufacturing a probe card according to clause 1, after the connecting the inside of the concave portions of the metal base material and the connection pads of the wiring substrate, but before the forming of the resin portion, further comprising:

covering an outer face of the wire with a resin layer; and covering an outer face of the resin layer with a metal layer, wherein the wire is formed as a coaxial-type wire.

(Clause 3) The method of manufacturing a probe card according to clause 1, wherein the preparing the metal base material in which the plurality of concave portions are formed includes:

patterning a plating resist on a first metal layer;

forming a second metal layer on an exposed face of the first metal layer by electroplating; and removing the plating resist to form the concave portions in the second metal layer, and wherein the connecting the inside of the concave portions of the metal base material and the connection pads of the wiring substrate includes to bury a metal electrode in a whole of the concave portion by the wire bonding method.

(Clause 4) The method of manufacturing a probe card according to clause 3, wherein the forming of the second metal layer includes to form a stepped portion in a lateral direction on an upper end part of the second metal layer by setting a thickness of the second metal layer thicker than a thickness of the plating resist.

(Clause 5) The method of manufacturing a probe card according to clause 1, wherein the metal base material is a copper foil, and the contact terminals and the wires are formed of gold.

(Clause 6) A test method of electric characteristics of a test object, comprising;

using a probe card, including, a wiring substrate including an opening portion and a connection pad arranged on an upper face of the wiring substrate located on a periphery of the opening portion;

a resin portion formed in the opening portion of the wiring substrate, and the resin portion formed of a material having elasticity;

a contact terminal arranged to protrude from a lower face of the resin portion; and a wire buried in the resin portion and connecting the contact terminal and the connection pad, wherein the contact terminal is formed of an end part of the wire, and an electric measurement is performed by touching two adjacent said contact terminals to one electrode pad of the test object.

(Clause 7) A test method of electric characteristics of a test object, comprising;

using a probe card, including, a wiring substrate including an opening portion and a connection pad arranged on an upper face of the wiring substrate located on a periphery of the opening portion;

a resin portion formed in the opening portion of the wiring substrate, and the resin portion formed of a material having elasticity;

a contact terminal arranged to protrude from a lower face of the resin portion; and a wire buried in the resin portion and connecting the contact terminal and the connection pad, wherein the contact terminal is formed of an end part of the wire, and an electric measurement is performed by touching one said contact terminal in which two said wires are connected to one electrode pad of the test object.

What is claimed is:

1. A probe card, comprising:
a wiring substrate including an insulating layer and a wiring layer formed on the insulating layer;
an opening portion penetrating the insulating layer and the wiring layer of the wiring substrate in a thickness direction, the opening portion having a quadrangle shape in a plan view, wherein four side faces of the opening portion are formed in a stepped shape and have stepped faces;
a connection pad arranged on the stepped faces of the side faces of the opening portion, the connection pad exposed from an inner face of the opening portion, the connection pad connected to one of the wiring layer;
a resin portion formed in the opening portion of the wiring substrate, the resin portion formed of a material having elasticity, the resin portion burying the connection pad;
a contact terminal arranged to protrude downward from a lower face of the resin portion in a state that a whole of a side face of the contact terminal is exposed from the resin portion, wherein a contact face of the contact terminal is a concave curved face; and
a wire buried in the resin portion and connecting the contact terminal and the connection pad, wherein the contact terminal and the wire are formed of the same metal, and a diameter of the contact terminal is larger than a diameter of the wire, and a connection part with the wire in one edge side of the contact terminal is buried in the resin portion, and the other edge side of the contact terminal is exposed from the resin layer.

2. The probe card according to claim 1, wherein the resin portion protrudes from a lower face of the wiring substrate.

3. The probe card according to claim 1, wherein the wire is a coaxial-type wire in which a resin layer and a metal layer are covered on an outer face of a metal wire.

4. The probe card according to claim 1, wherein a contact face of a tip of the contact terminal is formed as a flat face.

5. A probe card, comprising:
a wiring substrate including an insulating layer and a wiring layer formed on the insulating layer;
an opening portion penetrating the insulating layer and the wiring layer of the wiring substrate in a thickness direction;
a connection pad arranged on an upper face of the wiring substrate located on a periphery of the opening portion, the connection pad exposed from an inner face of the opening portion, the connection pad connected to one of the wiring layer;
a resin portion formed in the opening portion of the wiring substrate, the resin portion formed of a material having elasticity, the resin portion burying the connection pad;
a contact terminal arranged to protrude from a lower face of the resin portion, wherein the contact terminal includes a columnar contact portion protruding from the lower face of the resin portion, and a convex portion wider than the columnar contact portion, the convex portion which is arranged on the columnar contact portion and is buried in the resin portion, and a contact face of a tip of the contact terminal is formed as a flat face; and
a wire buried in the resin portion and connecting the contact terminal and the connection pad,
wherein the contact terminal and the wire are formed of the same metal, and a diameter of the contact terminal is larger than a diameter of the wire, and a connection part with the wire in one edge side of the contact terminal is buried in the resin portion, and the other edge side of the contact terminal is exposed from the resin layer.

6. A probe card, comprising:
a wiring substrate including an insulating layer and a wiring layer formed on the insulating layer;
an opening portion penetrating the insulating layer and the wiring layer of the wiring substrate in a thickness direction;
a connection pad arranged on an upper face of the wiring substrate located on a periphery of the opening portion, the connection pad exposed from an inner face of the opening portion, the connection pad connected to one of the wiring layer;
a resin portion formed in the opening portion of the wiring substrate, the resin portion formed of a material having elasticity, the resin portion burying the connection pad;
a contact terminal arranged to protrude from a lower face of the resin portion, wherein the contact terminal includes a columnar contact portion protruding from the lower face of the resin portion, and a convex portion wider than the columnar contact portion, the convex portion which is arranged on the columnar contact portion and is buried in the resin portion, and a constricted portion that is recessed inward in an annular part between the contact portion and the convex portion, and a contact face of a tip of the contact terminal is formed as a flat face; and
a wire buried in the resin portion and connecting the contact terminal and the connection pad,
wherein the contact terminal and the wire are formed of the same metal, and a diameter of the contact terminal is larger than a diameter of the wire, and a connection part with the wire in one edge side of the contact terminal is buried in the resin portion, and the other edge side of the contact terminal is exposed from the resin layer.

* * * * *